(12) United States Patent
Nakamura

(10) Patent No.: US 11,294,280 B2
(45) Date of Patent: Apr. 5, 2022

(54) COLORING COMPOSITION, CURED FILM, PATTERN FORMING METHOD, COLOR FILTER, SOLID-STATE IMAGING ELEMENT, AND IMAGE DISPLAY DEVICE

(71) Applicant: FUJIFILM Corporation, Tokyo (JP)

(72) Inventor: Shoichi Nakamura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/708,684

(22) Filed: Dec. 10, 2019

(65) Prior Publication Data

US 2020/0110334 A1    Apr. 9, 2020

Related U.S. Application Data

(63) Continuation of application No. PCT/JP2018/026786, filed on Jul. 17, 2018.

(30) Foreign Application Priority Data

Aug. 21, 2017   (JP) .............................. JP2017-158756

(51) Int. Cl.

| | |
|---|---|
| *G03F 7/031* | (2006.01) |
| *G02B 5/20* | (2006.01) |
| *G03F 7/00* | (2006.01) |
| *G03F 7/004* | (2006.01) |
| *H04N 9/04* | (2006.01) |
| *G02F 1/1335* | (2006.01) |
| *G03F 7/16* | (2006.01) |
| *G03F 7/20* | (2006.01) |
| *G03F 7/32* | (2006.01) |
| *G03F 7/38* | (2006.01) |
| *G03F 7/40* | (2006.01) |

(52) U.S. Cl.
CPC ............. *G03F 7/031* (2013.01); *G02B 5/208* (2013.01); *G03F 7/0007* (2013.01); *G03F 7/0045* (2013.01); *G02F 1/133514* (2013.01); *G03F 7/162* (2013.01); *G03F 7/168* (2013.01); *G03F 7/2004* (2013.01); *G03F 7/322* (2013.01); *G03F 7/38* (2013.01); *G03F 7/40* (2013.01); *H04N 9/0455* (2018.08)

(58) Field of Classification Search
CPC ........ G03F 7/0048; G03F 7/033; G03F 7/105; G03F 7/0007; G03F 7/0045; G03F 7/0388; G03F 7/031; G03F 7/162; G03F 7/38; G03F 7/168; G03F 7/2004; G03F 7/322; G03F 7/40; G03F 7/029; G03F 7/027; G03F 7/004; G03F 7/0047; G02B 5/223; G02B 5/20; G02B 5/208; G02B 5/201; G02F 1/133514; G02F 1/133512; H04N 9/0455; H01L 51/5284
See application file for complete search history.

(56) References Cited

U.S. PATENT DOCUMENTS

| | | | | |
|---|---|---|---|---|
| 4,288,527 | A * | 9/1981 | Morgan | ............... C08F 22/1006 430/288.1 |
| 4,560,457 | A | 12/1985 | Ogawa | |
| 2010/0126386 | A1 * | 5/2010 | Haremza | ................. G03F 7/031 106/287.21 |
| 2015/0329735 | A1 | 11/2015 | Nakamura et al. | |
| 2017/0313801 | A1 | 11/2017 | Takeo et al. | |

FOREIGN PATENT DOCUMENTS

| | | | | |
|---|---|---|---|---|
| JP | 57-053508 | A | | 3/1982 |
| JP | 57-105472 | A | | 6/1982 |
| JP | 2002-275205 | A | | 9/2002 |
| JP | 2005-115151 | A | | 4/2005 |
| JP | 2007-333885 | A | | 12/2007 |
| JP | 2008-015200 | A | | 1/2008 |
| JP | 2012-053465 | A | | 3/2012 |
| JP | 2012-098599 | A | | 5/2012 |
| JP | 2018-070738 | A | | 5/2018 |
| WO | WO-2015053183 | A1 * | 4/2015 | ........... G03F 7/0047 |
| WO | WO-2015080217 | A1 * | 6/2015 | ........... G03F 7/0007 |
| WO | 2016/072142 | A1 | | 5/2016 |
| WO | 2017/043428 | A1 | | 3/2017 |

OTHER PUBLICATIONS

English Translation of JP 2007-333,885 A; Kazunori Yamada; Published Dec. 27, 2007 (Year: 2007).*
English Translation of WO 2015/080217 A1; Shiharu Hiraoka; Published: Jun. 4, 2015 (Year: 2015).*
English Translation of WO 2015/053183 A1; Shoichi Nakamura; Published: Apr. 16, 2015 (Year: 2015).*
International Search Report dated Sep. 4, 2018 from the International Searching Authority in International Application No. PCT/JP2018/026786.
Written Opinion dated Sep. 4, 2018 from the International Bureau in International Application No. PCT/JP2018/026786.
International Preliminary Report on Patentability dated Feb. 25, 2020 from the International Bureau in International Application No. PCT/JP2018/026786.
Communication dated Feb. 16, 2021, from the Japanese Patent Office in Application No. 2019-537985.
Office Action dated Jul. 13, 2021 by the Taiwanese Patent Office in TW application No. 107125380.
Office Action dated Oct. 5, 2021 in Japanese Application No. 2019-537985.

* cited by examiner

*Primary Examiner* — Duane Smith
*Assistant Examiner* — Richard Champion
(74) *Attorney, Agent, or Firm* — Sughrue Mion, PLLC

(57) ABSTRACT

A coloring composition includes a colorant, a radically polymerizable compound, a photo-radical polymerization initiator, and a thermal-radical polymerization initiator, in which the thermal-radical polymerization initiator includes at least one selected from a pinacol compound or an α-hydroxyacetophenone compound.

16 Claims, No Drawings

COLORING COMPOSITION, CURED FILM, PATTERN FORMING METHOD, COLOR FILTER, SOLID-STATE IMAGING ELEMENT, AND IMAGE DISPLAY DEVICE

CROSS-REFERENCE TO RELATED APPLICATIONS

This application is a Continuation of PCT International Application No. PCT/JP2018/26786, filed on Jul. 17, 2018, which claims priority under 35 U.S.C. § 119(a) to Japanese Patent Application No. 2017-158756, filed on Aug. 21, 2017. Each of the above application(s) is hereby expressly incorporated by reference, in its entirety, into the present application.

BACKGROUND OF THE INVENTION

1. Field of the Invention

The present invention relates to a coloring composition. More specifically, the present invention relates to a coloring composition including a colorant, a radically polymerizable compound, a photo-radical polymerization initiator, and a thermal-radical polymerization initiator. The present invention further relates to a cured film, a pattern forming method, a color filter, a solid-state imaging element, and an image display device, each of which uses the coloring composition.

2. Description of the Related Art

In recent years, as a digital camera, a mobile phone with a camera, and the like have been further spreading, there has been a greatly increasing demand for a solid-state imaging element such as a charge coupled device (CCD) image sensor. A color filter has been used as a key device in a display or an optical element.

A color filter has been produced, for example, using such as a composition including a colorant, a radically polymerizable compound, and a photo-radical polymerization initiator.

Moreover, in JP2012-098599A, it is described that a color filter is produced using a coloring composition including a pigment and a polymerizable monomer having a specific structure. In JP2012-098599A, it is described that a photopolymerization initiator or a thermal polymerization initiator may be contained in the coloring composition for the purpose of curing a film. In addition, in paragraph 0153, it is described that an azo compound, an organic peroxide, or hydrogen peroxide as the thermal polymerization initiator, and in particular, the azo compound is suitable.

SUMMARY OF THE INVENTION

In recent years, moisture resistance as one of characteristics of a cured film for use in a color filter has been required to be excellent. In addition, in a coloring composition for use in the production of a cured film such as a color filter, it is desirable that storage stability is excellent.

On the other hand, in JP2012-098599A, it is described that a photopolymerization initiator or a thermal polymerization initiator may be contained in a coloring composition for the purpose of curing a film. However, according to the studies conducted by the present inventors, it was found that in the invention described in JP2012-098599A, it is difficult to achieve both storage stability and moisture resistance.

Therefore, an object of the present invention is to provide a coloring composition capable of forming a cured film having excellent storage stability as well as excellent moisture resistance. Another object of the present invention is to provide a cured film, a pattern forming method, a color filter, a solid-state imaging element, and an image display device.

According to the studies conducted by the present inventors, it was found that it is possible to form a cured film having excellent storage stability as well as excellent moisture resistance with a coloring composition including a colorant, a radically polymerizable compound, and a photoradical polymerization initiator, in which a predetermined thermal-radical polymerization initiator is further incorporated into the coloring composition, thereby completing the present invention. The present invention provides the following aspects.

<1> A coloring composition comprising:
a colorant;
a radically polymerizable compound;
a photo-radical polymerization initiator; and
a thermal-radical polymerization initiator,
in which the thermal-radical polymerization initiator includes at least one selected from a pinacol compound or an α-hydroxyacetophenone compound.

<2> A coloring composition comprising:
a colorant;
a radically polymerizable compound;
a photo-radical polymerization initiator; and
a thermal-radical polymerization initiator,
in which the thermal-radical polymerization initiator includes a compound having a molar absorption coefficient at a wavelength of 365 nm of 100 L×mol$^{-1}$×cm$^{-1}$ or less and a thermal decomposition temperature of 120° C. to 270° C.

<3> The coloring composition as described in <2>,
in which the thermal-radical polymerization initiator includes at least one selected from a pinacol compound or an α-hydroxy acetophenone compound.

<4> The coloring composition as described in any one of <1> to <3>,
in which the coloring composition includes 10 to 1,000 parts by mass of the thermal-radical polymerization initiator with respect to 100 parts by mass of the photo-radical polymerization initiator.

<5> The coloring composition as described in any one of <1> to <4>,
in which the coloring composition includes 1 to 200 parts by mass of the photo-radical polymerization initiator and 1 to 200 parts by mass of the thermal-radical polymerization initiator with respect to 100 parts by mass of the radically polymerizable compound.

<6> The coloring composition as described in any one of <1> to <5>, further comprising:
an alkali-soluble resin.

<7> A cured film obtained from the coloring composition as described in any one of <1> to <6>.

<8> A pattern forming method comprising:
forming a coloring composition layer on a support with the coloring composition as described in any one of <1> to <6>;
patternwise exposing the coloring composition layer;
removing an unexposed area of the coloring composition by development to form a pattern; and
heating the pattern after development.

<9> A color filter comprising the cured film as described in <7>.

<10> A solid-state imaging element comprising the color filter as described in <9>.

<11> An image display device comprising the color filter as described in <9>.

According to the present invention, it is possible to provide a coloring composition capable of forming a cured film having excellent storage stability as well as excellent moisture resistance. It is also possible to provide a cured film having excellent moisture resistance, a pattern forming method, a color filter, a solid-state imaging element, and an image display device.

DESCRIPTION OF THE PREFERRED EMBODIMENTS

Hereinafter, the contents of the present invention will be described in detail.

In citations for a group (atomic group) in the present specification, in a case where the group is denoted without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group).

In the present specification, "exposure" includes, unless otherwise specified, not only exposure using light but also lithography using particle rays such as electron beams and ion beams. In addition, examples of light used for the exposure generally include actinic rays or radiation such as a bright line spectrum of a mercury lamp, far ultraviolet rays typified by an excimer laser, extreme ultraviolet rays (EUV light), X-rays, electron beams, or the like.

In the present specification, a numerical range expressed using "to" means a range that includes the preceding and succeeding numerical values of "to" as the lower limit value and the upper limit value, respectively.

In the present specification, the total solid content refers to a total amount of the components other than a solvent from all the components of a composition.

In the present specification, "(meth)acrylate" represents either or both of acrylate and methacrylate, "(meth)acryl" represents either or both of acryl and methacryl, "(meth)allyl" represents either or both of allyl and methallyl, and "(meth)acryloyl" represents either or both of acryloyl and methacryloyl.

In the present specification, the term "step" not only means an independent step, but also includes a step which is not clearly distinguished from other steps in a case where an intended action of the step is obtained.

In the present specification, a weight-average molecular weight (Mw) and a number-average molecular weight (Mn) are each defined as a value in terms of polystyrene through measurement by means of gel permeation chromatography (GPC).

<Coloring Composition>

A first aspect of the coloring composition of an embodiment of the present invention includes a colorant, a radically polymerizable compound, a photo-radical polymerization initiator, and a thermal-radical polymerization initiator, in which the thermal-radical polymerization initiator includes at least one selected from a pinacol compound or an α-hydroxyacetophenone compound. Furthermore, a second aspect of the coloring composition of the embodiment of the present invention includes a colorant, a radically polymerizable compound, a photo-radical polymerization initiator, and a thermal-radical polymerization initiator, in which the thermal-radical polymerization initiator includes a compound having a molar absorption coefficient at a wavelength of 365 nm of 100 L×mol$^{-1}$×cm$^{-1}$ or less and a thermal decomposition temperature of 120° C. to 270° C. That is, in the first aspect of the coloring composition of the embodiment of the present invention, at least one selected from a pinacol compound or an α-hydroxy acetophenone compound is used as the thermal-radical polymerization initiator. In addition, in the second aspect of the coloring composition of the embodiment of the present invention, a compound having a molar absorption coefficient at a wavelength of 365 nm of 100 L×mol$^{-1}$×cm$^{-1}$ or less and a thermal decomposition temperature of 120° C. to 270° C. is used as the thermal-radical polymerization initiator.

According to the present invention, it is possible to provide a coloring composition capable of forming a cured film having excellent storage stability and excellent moisture resistance by incorporating a thermal-radical polymerization initiator into the coloring composition including a colorant, a radically polymerizable compound, and a photo-radical polymerization initiator. A reason why such an effect is obtained is presumed as follows. It is considered that in a case where the thermal-radical polymerization initiator has low stability, radicals are generated through decomposition of the thermal-radical polymerization initiator, and the like during storage of the coloring composition, the radicals make a polymerization reaction of the radically polymerizable compound proceed, and thus, a viscosity and the like of the coloring composition tend to increase over time, but the thermal-radical polymerization initiator can exist stably in the coloring composition. Therefore, the coloring composition of the embodiment of the present invention can suppress an increase in the viscosity during storage, and thus, the storage stability is excellent. In addition, it is considered that it is possible to reduce a residual amount of the unreacted radically polymerizable compound in a cured film thus obtained, for example, by forming a pattern and the like by performing exposure and development through incorporation of the thermal-radical polymerization initiator, and then further performing a heat treatment, which is presumed to make it possible to obtain a cured film having excellent moisture resistance.

In addition, the coloring composition of the embodiment of the present invention has excellent photolithographic properties. It is considered that the thermal-radical polymerization initiator has high stability against light used for exposure, which is presumed to be due to suppression of the generation of radicals from the thermal-radical polymerization initiator during exposure. Hereinafter, the respective components that can constitute the coloring composition of the embodiment of the present invention will be described.

《Colorant》

The coloring composition of the embodiment of the present invention contains a colorant. In the present invention, the colorant may be either a pigment or a dye. The colorant may be used in combination of the pigment and the dye. The colorant used in the present invention preferably includes the pigment. Further, a content of the pigment in the colorant is preferably 50% by mass or more, more preferably 70% by mass or more, still more preferably 80% by mass or more, and particularly preferably 90% by mass or more. In addition, the colorant may be only constituted with the pigment.

Examples of the pigment include an inorganic pigment and an organic pigment, and the organic pigment is preferable. The average particle diameter of the pigment is preferably 20 to 300 nm, more preferably 25 to 250 nm, and still more preferably 30 to 200 nm. The "average particle diameter" as mentioned herein means an average particle diameter for secondary particles formed by aggregation of primary particles of a pigment. Further, the particle size distribution (hereinafter simply also referred to as a "particle size distribution") of the secondary particles of a pigment that can be used is preferably a particle size distribution such that secondary particles falling within (average particle diameter±100) nm accounts for 70% by mass or more, and preferably 80% by mass or more of all the particles. In addition, the particle size distribution of the secondary particles can be measured using a scattering intensity distribution. In addition, the average particle diameter of the primary particles can be determined by measuring the particle sizes of 100 particles in an area in which particles are not aggregated by observation with a scanning electron microscope (SEM) or a transmission electron microscope (TEM) and calculating an average value thereof.

Specific examples of the organic pigment include pigments shown below. The organic pigments shown below may be used singly or in combination of two or more kinds thereof.

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like (all yellow pigments);

C. I. Pigment Orange 2, 5, 13, 16, 17:1, 31, 34, 36, 38, 43, 46, 48, 49, 51, 52, 55, 59, 60, 61, 62, 64, 71, 73, and the like (all orange pigments);

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 269, 270, 272, 279, and the like (all red pigments);

C. I. Pigment Green 7, 10, 36, 37, 58, 59, and the like (all green pigments);

C. I. Pigment Violet 1, 19, 23, 27, 32, 37, 42, and the like (all violet pigments);

C. I. Pigment Blue 1, 2, 15, 15:1, 15:2, 15:3, 15:4, 15:6, 16, 22, 60, 64, 66, 79, 80, and the like (all blue pigments).

Furthermore, a halogenated zinc phthalocyanine pigment having an average number of halogen atoms in one molecule of 10 to 14, an average number of bromine atoms in one molecule of 8 to 12, and an average number of chlorine atoms in one molecule of 2 to 5 can also be used as the green pigment. Specific examples thereof include the compounds described in WO2015/118720A.

In addition, an aluminum phthalocyanine compound having a phosphorus atom can also be used as the blue pigment. Specific examples thereof include the compounds described in paragraphs 0022 to 0030 of JP2012-247591A and paragraph 0047 of JP2011-157478A.

The dye is not particularly limited and known dyes can be used. As chemical structures thereof, a pyrazolazo-based dye, an anilinoazo-based dye, a triarylmethane-based dye, an anthraquinone-based dye, an anthrapyridone-based dye, a benzylidene-based dye, an oxonol-based dye, a pyrazolotriazolazo-based dye, a pyridonazo-based dye, a cyanine-based dye, a phenothiazine-based dye, a pyrrolopyrazolazomethine-based dye, a xanthene-based dye, a phthalocyanine-based dye, a benzopyran-based dye, an indigo-based dye, a pyromethane-based dye, or the like can be used. Further, the thiazole compounds described in JP2012-158649A, the azo compound described in JP2011-184493A, or the azo compound described in JP2011-145540A can also be preferably used. Furthermore, as yellow pigments, the quinophthalone compounds described in paragraph Nos. 0011 to 0034 of JP2013-054339A, the quinophthalone compounds described in paragraph Nos. 0013 to 0058 of JP2014-026228A, or the like can be used.

In the present invention, a dye multimer can be used as the colorant. The dye multimer is preferably a dye that is used after being dissolved in a solvent, but the dye multimer may form a particle. In a case where the dye multimer is the particle, it is usually used in a state of being dispersed in a solvent. The dye multimer in the particle state can be obtained by, for example, emulsion polymerization, and specific examples thereof include the compounds and production methods described in JP2015-214682A. The dye multimer has 2 or more dye structures, and preferably 3 or more dye structures in one molecule. The upper limit is particularly not limited, but can be 100 or less. The dye structures contained in one molecule may be the same dye structures or different dye structures.

The weight-average molecular weight (Mw) of the dye multimer is preferably 2,000 to 50,000. The lower limit is more preferably 3,000 or more, and still more preferably 6,000 or more. The upper limit is more preferably 30,000 or less, and still more preferably 20,000 or less.

The dye structure that the dye multimer has may be a structure derived from a dye compound having absorption in the visible region (preferably at a wavelength in the range of 400 to 700 nm, and more preferably at a wavelength in the range of 400 to 650 nm). Examples thereof include a triaryl methane dye structure, a xanthene dye structure, an anthraquinone dye structure, a cyanine dye structure, a squarylium dye structure, a quinophthalone dye structure, a phthalocyanine dye structure, a subphthalocyanine dye structure, an azo dye structure, a pyrazolotriazole dye structure, a dipyromethane dye structure, an isoindoline dye structure, a thiazole dye structure, a benzimidazolone dye structure, a perinone dye structure, a pyrrolopyrrole dye structure, a diketopyrrolopyrrole dye structure, a diimmonium dye structure, a naphthalocyanine dye structure, a rylene dye structure, a dibenzofuranone dye structure, a merocyanine dye structure, a croconium dye structure, and an oxonol dye structure.

It is preferable that the dye multimer includes at least one of a repeating unit represented by Formula (A), a repeating unit represented by Formula (B), or a repeating unit represented by Formula (C), or is represented by Formula (D).

-continued

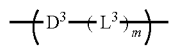  (C)

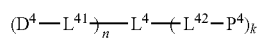  (D)

In Formula (A), $X^1$ represents the main chain of the repeating unit, $L^1$ represents a single bond or a divalent linking group, and $D^1$ represents a dye structure. With regard to the details of Formula (A), reference can be made to paragraphs 0138 to 0152 of JP2013-029760A, the contents of which are incorporated herein by reference.

In Formula (B), $X^2$ represents the main chain of the repeating unit, $L^2$ represents a single bond or a divalent linking group, $D^2$ represents a dye structure having a group that can be bonded to $Y^2$ by an ion bond or a coordination bond, and $Y^2$ represents a group that can be bonded to $D^2$ by an ion bond or a coordination bond. With regard to the details of Formula (B), reference can be made to paragraph Nos. 0156 to 0161 of JP2013-029760A, the contents of which are incorporated herein by reference.

In Formula (C), $L^3$ represents a single bond or a divalent linking group, $D^3$ represents a dye structure, and m represents 0 or 1. With regard to the details of Formula (C), reference can be made to paragraphs 0165 to 0167 of JP2013-029760A, the contents of which are incorporated herein by reference.

In Formula (D), $L^4$ represents an (n+k)-valent linking group, $L^{41}$ and $L^{42}$ each independently represent a single bond or a divalent linking group, $D^4$ represents a dye structure, and $P^4$ represents a substituent; and n represents 2 to 15, k represents 0 to 13, and n+k is 2 to 15. In a case where n is 2 or more, a plurality of $D^4$'s may be the same as or different from each other. In a case where k is 2 or more, a plurality of $P^4$'s may be the same as or different from each other.

Examples of the (n+k)-valent linking group represented by $L^4$ include the linking group described in paragraph Nos. 0071 to 0072 of JP2008-222950A, and the linking group described in paragraph No. 0176 of JP2013-029760A.

Examples of the substituent represented by $P^4$ include an acid group and a curable group. Examples of the curable group include a radically polymerizable group such as a group having an ethylenically unsaturated group, an epoxy group, an oxazoline group, and a methylol group. Examples of the group having an ethylenically unsaturated group include a vinyl group, a (meth)allyl group, and a (meth)acryloyl group. Examples of the acid group include a carboxyl group, a sulfonic acid group, and a phosphoric acid group. The substituent represented by $P^4$ may be a monovalent polymer chain having a repeating unit. The monovalent polymer chain having a repeating unit is preferably a monovalent polymer chain having a repeating unit derived from a vinyl compound.

The dye structure represented by $D^4$ is a structure formed by removing any of one or more atoms contained in the dye compound, or formed by the bonding of a part of the dye compound to $L^{41}$. Further, the dye structure may be a polymer chain including a repeating unit having a dye structure (structure formed by removing any of one or more atoms contained in the dye compound) in the main chain or side chain. The polymer chain may include a dye structure, and it is not particularly determined, but is preferably one selected from a (meth)acryl-based resin, a styrene-based resin, and a (meth)acryl/styrene-based resin. The repeating unit of the polymer chain is not particularly determined, but examples thereof include the repeating unit represented by Formula (A) and the repeating unit represented by Formula (C). In addition, the total amount of the repeating units having a dye structure out of all the repeating units constituting the polymer chain is preferably 5% to 60% by mole, more preferably 10% to 50% by mole, and still more preferably 20% to 40% by mole.

The dye multimer represented by Formula (D) is preferably a structure represented by Formula (D-1).

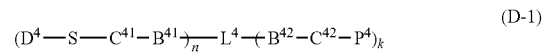  (D-1)

In Formula (D-1), $L^4$ represents an (n+k)-valent linking group. n represents 2 to 15, and k represents 0 to 13. $D^4$ represents a dye structure, and $P^4$ represents a substituent. $B^{41}$ and $B^{42}$ each independently represent a single bond, —O—, —S—, —CO—, —NR—, —O$_2$C—, —CO$_2$—, —NROC—, or —CONR—. R represents a hydrogen atom, an alkyl group, or an aryl group. $C^{41}$ and $C^{42}$ each independently represent a single bond or a divalent linking group. S represents a sulfur atom. In a case where n is 2 or more, a plurality of $D^4$'s may be the same as or different from each other. In a case where k is 2 or more, a plurality of $P^4$'s may be the same as or different from each other. n+k is 2 to 15.

$L^4$, $D^4$, and $P^4$ in Formula (D-1) have the same definitions as $L^4$, $D^4$, and $P^4$ in Formula (D).

$B^{41}$ and $B^{42}$ in Formula (D-1) are each preferably a single bond, —O—, —CO—, —O$_2$C—, —CO$_2$—, —NROC—, or —CONR—, and more preferably a single bond, —O—, —CO—, —O$_2$C—, or —CO$_2$—. R represents a hydrogen atom, an alkyl group, or an aryl group.

As the divalent linking group represented by $C^{41}$ and $C^{42}$ in Formula (D-1), an alkylene group, an arylene group, and a group formed by combination of these groups are preferable. The alkylene group preferably has 1 to 30 carbon atoms, and more preferably has 1 to 10 carbon atoms. The alkylene group may be linear, branched, or cyclic. The arylene group preferably has 6 to 30 carbon atoms, and more preferably has 6 to 12 carbon atoms.

In addition, as the dye multimer, the compounds described in JP2011-213925A, JP2013-041097A, JP2015-028144A, JP2015-030742A, or the like can also be used.

The content of the colorant is preferably 20% by mass or more, more preferably 30% by mass or more, and still more preferably 40% by mass or more, with respect to the total solid content of the coloring composition. The upper limit can be set to 80% by mass or less.

«Radically Polymerizable Compound»

The coloring composition of the embodiment of the present invention contains a radically polymerizable compound. Examples of the radically polymerizable compound include a compound having an ethylenically unsaturated group. Examples of the group having an ethylenically unsaturated group include a vinyl group, a (meth)allyl group, and a (meth)acryloyl group.

Any chemical forms of a monomer, a prepolymer, an oligomer, or the like may be used as the radically polymerizable compound, but the monomer is preferable. A molecular weight of the radically polymerizable compound is preferably 100 to 3,000. The upper limit is more preferably 2,000 or less and still more preferably 1,500 or less. The lower limit is more preferably 150 or more and still more preferably 250 or more.

The radically polymerizable compound is preferably a compound including three or more ethylenically unsaturated groups, more preferably a compound including 3 to 15 ethylenically unsaturated groups, and still more preferably a compound having 3 to 6 ethylenically unsaturated groups. In addition, the radically polymerizable compound is preferably a trifunctional to pentadecafunctional (meth)acrylate compound and more preferably a trifunctional to hexafunctional (meth)acrylate compound. Specific examples of the radically polymerizable compound include compounds described in paragraph Nos. 0095 to 0108 of JP2009-288705A, paragraph No. 0227 of JP2013-029760A, and paragraph Nos. 0254 to 0257 of JP2008-292970A, and the contents of which are incorporated herein by reference.

The radically polymerizable compound is preferably a compound such as dipentaerythritol triacrylate (as a commercially available product, KAYARAD D-330 manufactured by Nippon Kayaku Co., Ltd.); dipentaerythritol tetraacrylate (as a commercially available product, KAYARAD D-320 manufactured by Nippon Kayaku Co., Ltd.); dipentaerythritol penta(meth)acrylate (as a commercially available product, KAYARAD D-310 manufactured by Nippon Kayaku Co., Ltd.); dipentaerythritol hexa(meth)acrylate (as a commercially available product, KAYARAD DPHA manufactured by Nippon Kayaku Co., Ltd., NK ESTER A-DPH-12E, manufactured by Shin-Nakamura Chemical Co., Ltd.); and a compound having a structure in which the (meth)acryloyl group is bonded through an ethylene glycol and/or a propylene glycol residue (for example, SR454 and SR499 which are commercially available products from Sartomer). Oligomers of the above-described examples can also be used. As the radically polymerizable compound, NK ESTER A-TMMT (manufactured by Shin-Nakamura Chemical Co., Ltd.) and KAYARAD RP-1040 and DPCA-20 (manufactured by Nippon Kayaku Co., Ltd.) can also be used. In addition, as the radically polymerizable compound, it is preferable to use a trifunctional (meth)acrylate compound such as trimethylolpropane tri(meth)acrylate, trimethylolpropane propyleneoxide-modified tri(meth)acrylate, trimethylolpropane ethyleneoxide-modified tri(meth)acrylate, isocyanuric acid ethyleneoxide-modified tri(meth)acrylate, and pentaerythritol tri(meth)acrylate. Examples of a commercially available product of the trifunctional (meth) acrylate compound include ARONIX M-309, M-310, M-321, M-350, M-360, M-313, M-315, M-306, M-305, M-303, M-452, and M-450 (manufactured by TOAGOSEI CO., LTD.), NK ESTER A9300, A-GLY-9E, A-GLY-20E, A-TMM-3, A-TMM-3L, A-TMM-3LM-N, A-TMPT, and TMPT (manufactured by Shin-Nakamura Chemical Co., Ltd), and KAYARAD GPO-303, TMPTA, THE-330, TPA-330, and PET-30 (manufactured by Nippon Kayaku Co., Ltd.).

The radically polymerizable compound may have an acid group. By using a radically polymerizable compound having an acid group, a coloring composition layer in unexposed areas is easily removed in development and the generation of the development residue can be effectively suppressed. Examples of an acid group include a carboxyl group, a sulfo group, and a phosphoric acid group, and a carboxyl group is preferable. Examples of a commercially available product of the radically polymerizable compound having an acid group include ARONIX M-510, M-520, ARONIX TO-2349 (manufactured by TOAGOSEI CO., LTD.).

An acid value of the radically polymerizable compound is preferably 0.1 to 40 mgKOH/g and more preferably 5 to 30 mgKOH/g. In a case where an acid value of the radically polymerizable compound is 0.1 mgKOH/g or more, solubility in a developer is good, and in a case where an acid value of the polymerizable compound is 40 mgKOH/g or less, it is advantageous in production and handling.

The radically polymerizable compound is preferably a compound having a caprolactone structure. Examples of the radically polymerizable compound having a caprolactone structure include DPCA-20, DPCA-30, DPCA-60, and DPCA-120, each of which is commercially available as KAYARAD DPCA series from Nippon Kayaku Co., Ltd.

A compound having an alkyleneoxy group can also be used as the radically polymerizable compound. The radically polymerizable compound having an alkyleneoxy group is preferably a compound having an ethyleneoxy group and/or a propyleneoxy group, more preferably a compound having an ethyleneoxy group, and still more preferably a trifunctional to hexafunctional (meth)acrylate compound having 4 to 20 ethyleneoxy groups. Examples of a commercially available product of the radically polymerizable compound having an alkyleneoxy group include SR-494 manufactured by Sartomer, which is a tetrafunctional (meth) acrylate having four ethyleneoxy groups, and KAYARAD TPA-330 manufactured by Nippon Kayaku Co., Ltd., which is a trifunctional (meth)acrylate having three isobutyleneoxy groups.

The urethane acrylates described in JP1973-041708B (JP-S48-041708B), JP1976-037193A (JP-S51-037193A), JP1990-032293B (JP-H02-032293B), or JP1990-016765B (JP-H02-016765B), or the urethane compounds having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) are also suitable as the radically polymerizable compound. In addition, radically polymerizable compounds having an amino structure or a sulfide structure in the molecule described in JP1988-277653A (JP-S63-277653A), JP1988-260909A (JP-S63-260909A), or JP1989-105238A (JP-H01-105238A) are preferably used. Examples of a commercially available product include UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600 and AI-600 (manufactured by Kyoeisha Chemical Co., Ltd.).

The content of the radically polymerizable compound is preferably 0.1% to 50% by mass with respect to the total solid content of the coloring composition. The lower limit is more preferably 0.5% by mass or more and still more preferably 1% by mass or more. The upper limit is more preferably 45% by mass or less and still more preferably 40% by mass or less. The radically polymerizable compound may be used singly or in combination of two or more kinds thereof. In a case where the radically polymerizable compounds are used in combination of two or more kinds thereof, the total amount thereof is preferably within the above-mentioned range.

«Photo-Radical Polymerization Initiator»

The coloring composition of the embodiment of the present invention contains a photo-radical polymerization initiator. The photo-radical polymerization initiator is not particularly limited as long as having an ability to initiate a polymerization of the radically polymerizable compound and can be appropriately selected from known photo-radical polymerization initiators. For example, a compound having photosensitivity to light in a range from the ultraviolet range to the visible range is preferable. In addition, the photo-radical polymerization may be a compound that produces an active radical by causing some action with a photoexcited sensitizer.

In the present invention, the molar absorption coefficient at 365 nm of the photo-radical polymerization initiator is preferably more than 100 L×mol$^{-1}$×cm$^{-1}$, more preferably 1,000 L×mol$^{-1}$×cm$^{-1}$ or more, and still more preferably 2,000 L×mol$^{-1}$×cm$^{-1}$ or more.

Examples of the photo-radical polymerization initiator include halogenated hydrocarbon derivatives (for example, a compound having a triazine skeleton and a compound having an oxadiazole skeleton), an acylphosphine compound, hexaaryl biimidazole, an oxime compound, an organic peroxide, a thio compound, a ketone compound, an aromatic onium salt, and an α-aminoacetophenone compound. From the viewpoint of the exposure sensitivity, as the photo-radical polymerization initiator, a trihalomethyl triazine compound, a benzyl dimethyl ketal compound, an α-aminoacetophenone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, and a 3-aryl-substituted coumarin compound are preferable, a compound selected from an oxime compound, an α-aminoacetophenone compound, and an acylphosphine compound is more preferable, and an oxime compound is still more preferable. With regard to the photo-radical polymerization initiator, reference can be made to the description in paragraphs 0065 to 0111 of JP2014-130173A, the contents of which are incorporated herein by reference.

Examples of a commercially available product of the α-aminoacetophenone compound include IRGACURE-907, IRGACURE-369, IRGACURE-379, and IRGACURE-379EG (all manufactured by BASF). Examples of a commercially available product of the acylphosphine compound include IRGACURE-819 and DAROCUR-TPO (both manufactured by BASF).

As the oxime compound, for example, the compounds described in JP2001-233842A, the compounds described in JP2000-080068A, and the compounds described in JP2006-342166A can be used. Specific examples of the oxime compound include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

As the oxime compound, the compounds described in J. C. S. Perkin II (1979), pp. 1653 to 1660, J. C. S. Perkin II (1979), pp. 156 to 162, Journal of Photopolymer Science and Technology (1995), pp. 202 to 232, each of the publications of JP2000-066385A, JP2000-080068A, JP2004-534797A, and JP2006-342166A, or the like can also be used. As a commercially available product of the oxime compound, IRGACURE-OXE01, IRGACURE-OXE02, IRGACURE-OXE03, and IRGACURE-OXE04 (all manufactured by BASF) are also suitably used. In addition, TRONLY TR-PBG-304, TRONLY TR-PBG-309, and TRONLY TR-PBG-305 (manufactured by CHANGZHOU TRONLY NEW ELECTRONIC MATERIALS CO., LTD.), or ADEKA ARKLS NCI-930 and ADEKA OPTOMER N-1919 (all manufactured by ADEKA Corporation, a photopolymerization initiator 2 described in JP2012-014052A) can also be used.

Moreover, as oxime compounds other than the above-described oxime compounds, the compounds described in JP2009-519904A in which oxime is linked to N of a carbazole ring, the compounds described in U.S. Pat. No. 7,626,957B in which a hetero-substituent is introduced into a benzophenone moiety, the compounds described in JP2010-015025A in which a nitro group is introduced into a coloring agent site, the compounds described in US2009-0292039A, the ketoxime compounds described in WO2009/131189A, the compounds described in U.S. Pat. No. 7,556,910B, which contains a triazine skeleton and an oxime skeleton in the same molecule, the compound described in JP2009-221114A, which has an absorption maximum at 405 nm and has good sensitivity to a light source of g-rays, and the like may be used. Preferably, reference can be made to, for example, the descriptions in paragraph Nos. 0274 to 0306 of JP2013-029760A, the contents of which are incorporated herein by reference.

In the present invention, an oxime compound having a fluorene ring can also be used as the photo-radical polymerization initiator. Specific examples of the oxime compound having a fluorene ring include the compounds described in JP2014-137466A. The contents of the publications are incorporated herein by reference.

In the present invention, an oxime compound having a benzofuran skeleton can also be used as the photo-radical polymerization initiator. Specific examples thereof include the compounds OE-01 to OE-75 described in WO2015/036910A.

In the present invention, an oxime compound having a fluorine atom can also be used as the photo-radical polymerization initiator. Specific examples of the oxime compound having a fluorine atom include the compounds described in JP2010-262028A, the compounds 24, and 36 to 40 described in JP2014-500852A, and the compounds (C-3) described in JP2013-164471A. The contents of the publications are incorporated herein by reference.

In the present invention, an oxime compound having a nitro group can also be used as the photo-radical polymerization initiator. The oxime compound having a nitro group is also preferably used in the form of a dimer. Specific examples of the oxime compound having a nitro group include the compounds described in paragraph Nos. 0031 to 0047 of JP2013-114249A and paragraph Nos. 0008 to 0012 and 0070 to 0079 of JP2014-137466A, the compounds described in paragraph Nos. 0007 to 0025 of JP4223071B, and ADEKA ARKLS NCI-831 (manufactured by ADEKA Corporation).

Specific examples of the oxime compound which is preferably used in the present invention are shown below, but the present invention is not limited thereto.

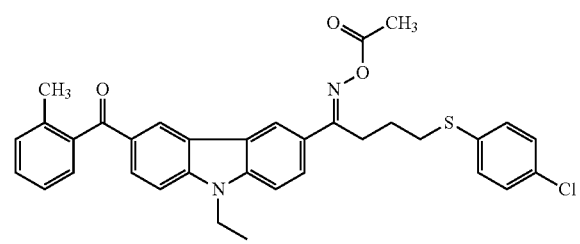

(C-1)

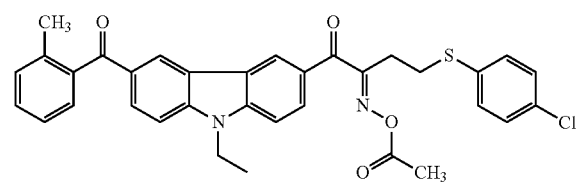

(C-2)

(C-3) 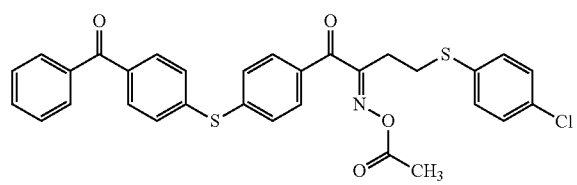
(C-4) 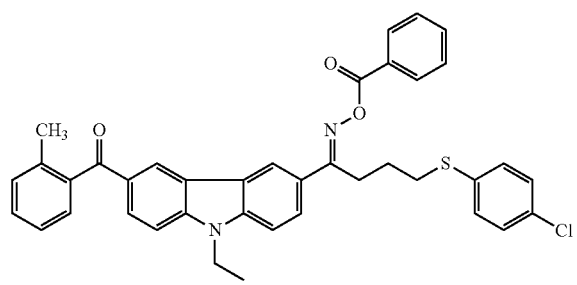
(C-5) 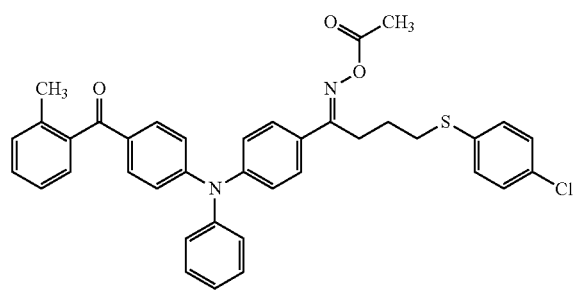
(C-6) 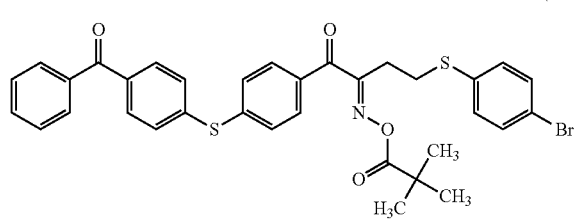
(C-7) 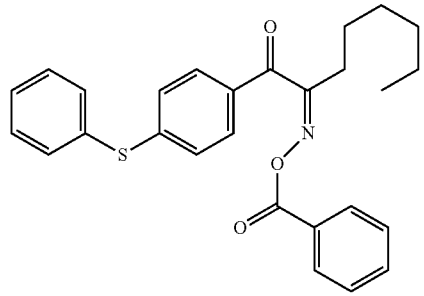
(C-8) 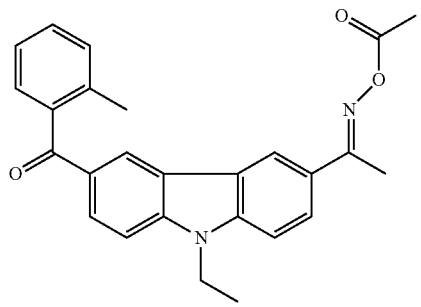
(C-9) 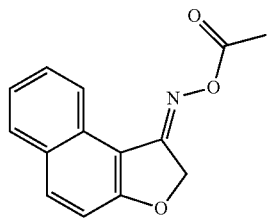
(C-10) 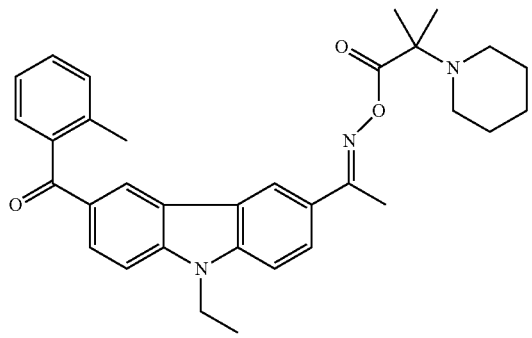
(C-11) 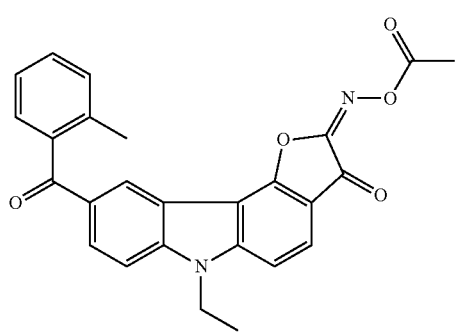
(C-12) 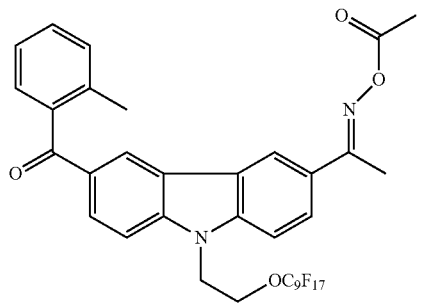

(C-13)

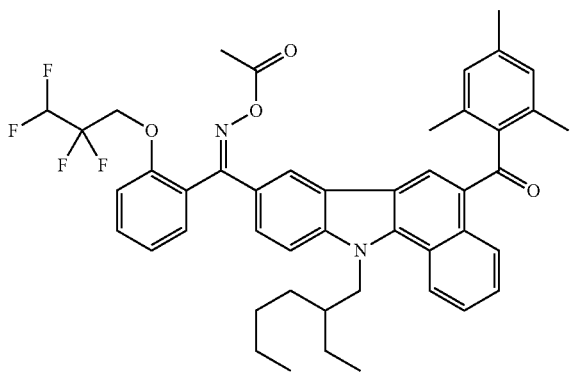

(C-14)

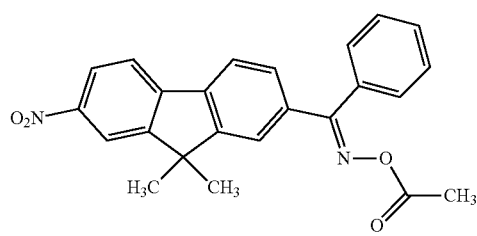

As the oxime compound, the compound having a maximum absorption wavelength in a wavelength range of 350 nm to 500 nm is preferable, the compound having a maximum absorption wavelength in a wavelength range of 360 nm to 480 nm is more preferable. The oxime compound is particularly preferably a compound showing a high absorbance at 365 nm and 405 nm.

From the viewpoint of sensitivity, the molar absorption coefficient at 365 nm or 405 nm of the oxime compound is preferably 1,000 to 300,000 L×mol$^{-1}$×cm$^{-1}$, more preferably 2,000 to 300,000 L×mol$^{-1}$×cm$^{-1}$, and particularly preferably 5,000 to 200,000 L×mol$^{-1}$×cm$^{-1}$.

A bifunctional, or trifunctional or higher photo-radical polymerization initiator may be used as the photo-radical polymerization initiator. Specific examples of such the photo-radical polymerization initiator include the dimers of the oxime compounds described in JP2010-527339A, JP2011-524436A, WO2015/004565A, paragraph Nos. 0412 to 0417 of JP2016-532675A, and paragraph Nos. 0039 to 0055 of WO2017/033680A, the compound (E) and the compound (G) described in JP2013-522445A, and Cmpd 1 to 7 described in WO2016/034963A.

The content of the photo-radical polymerization initiator is preferably 0.1% to 30% by mass, more preferably 0.5% to 20% by mass, and still more preferably 1% to 10% by mass, with respect to the total solid content of the coloring composition.

In addition, the content of the photo-radical polymerization initiator is preferably 1 to 200 parts by mass with respect to 100 parts by mass of the radically polymerizable compound. The upper limit is more preferably 180 parts by mass or less, still more preferably 150 parts by mass or less, and even more preferably 100 parts by mass or less. The lower limit is more preferably 5 parts by mass or more, still more preferably 10 parts by mass or more, and even more preferably 15 parts by mass or more.

The coloring composition of the embodiment of the present invention may include only one kind or two or more kinds of the photo-radical polymerization initiators. In a case of including two or more kinds of the photo-radical polymerization initiators, the total amount thereof is preferably within the above-mentioned range.

《Thermal-Radical Polymerization Initiator》

The coloring composition of the embodiment of the present invention contains a thermal-radical polymerization initiator. The thermal-radical polymerization initiator is a compound that initiates or accelerates the polymerization reaction of a radically polymerizable compound by generating radicals by heat energy. In the present invention, at least one selected from a pinacol compound or an α-hydroxyacetophenone compound is used as the thermal-radical polymerization initiator (first aspect), or a compound having a molar absorption coefficient at a wavelength of 365 nm of 100 L×mol$^{-1}$×cm$^{-1}$ or less and a thermal decomposition temperature of 120° C. to 270° C. is used as the thermal-radical polymerization initiator (second aspect).

Moreover, in the present invention, the molar absorption coefficient at a wavelength of 365 nm of the thermal-radical polymerization initiator is calculated by dissolving the thermal-radical polymerization initiator in a solvent to prepare a 5%-by-mole solution (measurement solution) of the thermal-radical polymerization initiator and measuring an absorbance of the measurement solution. Specifically, the above-mentioned measurement solution is put into a glass cell having a width of 1 cm, the absorbance is measured using a UV-Vis-NIR spectrometer (Cary 5000) manufactured by Agilent Technologies Inc., and the molar absorption coefficient (L×mol$^{-1}$×cm$^{-1}$) at a wavelength of 365 nm is calculated by applying the following equation.

$$\varepsilon = \frac{A}{cl}$$

In the equation, ε represents a molar absorption coefficient (L×mol$^{-1}$×cm$^{-1}$), A represents an absorbance, c represents a concentration of the measurement solution (mol/L), and l represents an optical path length (cm).

In the measurement of the molar absorption coefficient of the thermal-radical polymerization initiator, examples of the solvent for use in the preparation of the measurement solution include acetonitrile and chloroform. In a case where the thermal-radical polymerization initiator is a compound which is soluble in acetonitrile, the measurement solution is prepared with acetonitrile. The thermal-radical polymerization initiator is not dissolved in acetonitrile, but in a case where the thermal-radical polymerization initiator is a compound which is soluble in chloroform, the measurement solution is prepared with chloroform. Furthermore, the thermal-radical polymerization initiator is not dissolved in acetonitrile and chloroform, but in a case where the thermal-radical polymerization initiator is a compound which is soluble in dimethyl sulfoxide, the measurement solution is prepared with dimethyl sulfoxide.

In addition, the molar absorption coefficient at a wavelength of 365 nm of the above-mentioned photo-radical polymerization initiator can also be calculated in a similar manner.

Moreover, in the present invention, the thermal decomposition temperature of the thermal-radical polymerization initiator is a value measured by a thermogravimetric method.

The molar absorption coefficient at a wavelength of 365 nm of the thermal-radical polymerization initiator used in the first aspect is preferably 100 L×mol$^{-1}$×cm$^{-1}$ or less, more preferably 50 L×mol$^{-1}$×cm$^{-1}$ or less, and still more preferably 20 L×mol$^{-1}$×cm$^{-1}$ or less.

The thermal decomposition temperature of the thermal-radical polymerization initiator used in the first aspect is preferably is 270° C. or lower. The upper limit of the thermal decomposition temperature is more preferably 230° C. or lower, and still more preferably 200° C. or lower. The lower limit of the thermal decomposition temperature is preferably 100° C. or higher, more preferably 110° C. or higher, and still more preferably 120° C. or higher.

The molar absorption coefficient at a wavelength of 365 nm of the thermal-radical polymerization initiator used in the second aspect is 100 L×mol$^{-1}$×cm$^{-1}$ or less, preferably 70 L×mol$^{-1}$×cm$^{-1}$ or less, and more preferably 50 L×mol$^{-1}$×cm$^{-1}$ or less.

The thermal decomposition temperature of the thermal-radical polymerization initiator used in the second aspect is 120° C. to 270° C. The upper limit of the thermal decomposition temperature is preferably 230° C. or lower, and more preferably 200° C. or lower.

The thermal-radical polymerization initiator used in the second aspect is not particularly limited as long as it is a compound having the above-mentioned characteristics; examples thereof include a pinacol compound and an α-hydroxyacetophenone compound; and for a reason that the effects of the present invention can be more remarkably obtained, the pinacol compound or the α-hydroxyacetophenone compound is preferable, and the pinacol compound is more preferable.

The thermal-radical polymerization initiator used in the present invention is preferably a pinacol compound.

As the pinacol compound, a benzopinacol compound is preferable. Examples of the pinacol compound include compounds represented by Formulae (T-1) to (T-3).

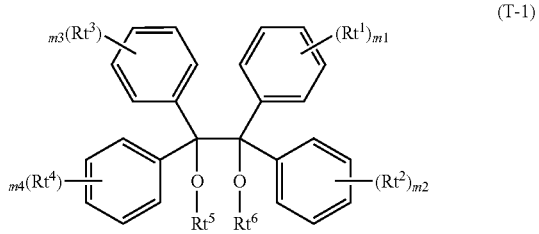

(T-1)

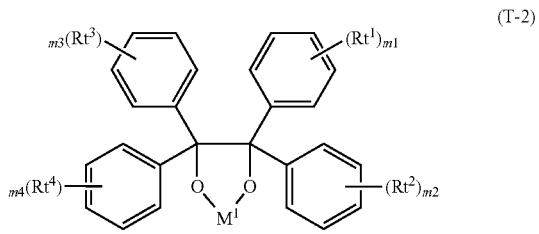

(T-2)

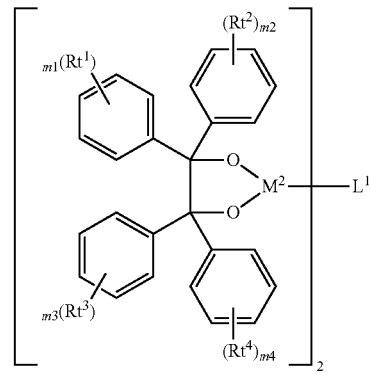

(T-3)

In Formulae (T-1) to (T-3), $Rt^1$ to $Rt^4$ each independently represent a substituent, and m1 to m4 each independently represent an integer of 0 to 4. In a case where m1 is 2 to 4, m1 pieces of $Rt^1$'s may be the same as or different from each other. Furthermore, 2 pieces of $Rt^1$'s out of m1 pieces of $Rt^1$'s may be bonded to each other to form a ring. In a case where m2 is 2 to 4, m2 pieces of $Rt^2$'s may be the same as or different from each other. Furthermore, 2 pieces of $Rt^2$'s out of m2 pieces of $Rt^2$'s may be bonded to each other to form a ring. In a case where m3 is 2 to 4, m3 pieces of $Rt^3$'s may be the same as or different from each other. Furthermore, 2 pieces of $Rt^3$'s out of m3 pieces of $Rt^3$'s may be bonded to each other to form a ring. In a case where m4 is 2 to 4, m4 pieces of $Rt^4$'s may be the same as or different from each other. Furthermore, 2 pieces of $Rt^4$'s out of m4 pieces of $Rt^4$'s may be bonded to each other to form a ring. In addition, $Rt^1$ and $Rt^2$, RV and $Rt^3$, $Rt^1$ and $Rt^4$, $Rt^2$ and $Rt^3$, $Rt^2$ and $Rt^4$, $Rt^3$ and $Rt^4$ may be bonded to each other to form a ring.

In Formula (T-1), $Rt^5$ and $Rt^6$ each independently represent a hydrogen atom, an alkyl group, an aryl group, Ti($R^{M1}$)($R^{M2}$)($R^{M3}$), Zr($R^{M1}$)($R^{M2}$)($R^{M3}$), Si($R^{M1}$)($R^{M2}$)($R^{M3}$), or B($R^{M1}$)($R^{M2}$), and $R^{M1}$ to $R^{M3}$ each independently represent a substituent.

In Formula (T-2), $M^1$ represents Ti($R^{M4}$)($R^{M5}$), Zr($R^{M4}$)($R^{M5}$), Si($R^{M4}$)($R^{M5}$), or B($R^{M4}$), and $R^{M4}$ and $R^{M5}$ each independently represent a substituent.

In Formula (T-3), $M^2$ represents Ti($R^{M6}$), Zr($R^{M6}$), Si($R^{M6}$), or B, $R^{M6}$ represents a substituent, and $L^1$ represents a divalent linking group.

Example of the substituents represented by RV to $Rt^4$ and $R^{M1}$ to $R^{M6}$ include an alkyl group, an aryl group, a heterocyclic group, a nitro group, a cyano group, a halogen atom, —$OR^{X1}$, —$SR^{X1}$, —$COR^{X1}$, —$COOR^{X1}$, —$OCOR^{X1}$, —$NR^{X1}R^{X2}$, —$NHCOR^{X1}$, —$CONR^{X1}R^{X2}$, —$NHCONR^{X1}R^{X2}$, —$NHCOOR^{X1}$, —$SO_2R^{X1}$, —$SO_2OR^{X1}$, and —$NHSO_2R^{X1}$. $R^{X1}$ and $R^{X2}$ each independently represent a hydrogen atom, an alkyl group, an aryl group, or a heterocyclic group.

Examples of the halogen atom include a fluorine atom, a chlorine atom, a bromine atom, and an iodine atom.

The number of carbon atoms of the alkyl group as the substituent, the alkyl group represented by each of $R^{X1}$ and $R^{X2}$, or the alkyl group represented by each of $Rt^5$ and $Rt^6$ in Formula (T-1) is preferably 1 to 20. The alkyl group may be any of linear, branched, and cyclic forms, and are preferably linear or branched.

The number of carbon atoms of the aryl group as the substituent, the aryl group represented by each of $R^{X1}$ and $R^{X2}$, or the aryl group represented by each of $Rt^5$ and $Rt^6$ in Formula (T-1) is preferably 6 to 20, more preferably 6 to 15, and still more preferably 6 to 10. The aryl group may be a single ring or a fused ring.

The heterocyclic group as the substituent and the heterocyclic group represented by each of $R^{X1}$ and $R^{X2}$ are each preferably a 5- or 6-membered ring. The heterocyclic group may be a single ring or a fused ring. The number of carbon atoms constituting the heterocyclic group is preferably 3 to 30, more preferably 3 to 18, and still more preferably 3 to 12. The number of heteroatoms constituting the heterocyclic group is preferably 1 to 3. It is preferable that the heteroatom constituting the heterocyclic group is a nitrogen atom, an oxygen atom, or a sulfur atom. In addition, at least some or all of the hydrogen atoms in the heterocyclic group may be substituted with the above-mentioned substituents.

m1 to m4 each independently represent an integer of 0 to 4, and is preferably 0 to 3, more preferably 0 to 2, still more preferably 0 or 1, and particularly preferably 0.

Examples of the divalent linking group represented by $L^1$ include an alkylene group, an arylene group, —NR'— (R' represents a hydrogen atom, an alkyl group which may have a substituent, or an aryl group which may have a substituent, and is preferably the hydrogen atom), —$SO_2$—, —CO—, —COO—, —OCO—, —O—, —S—, and a group formed by combination thereof.

In Formula (T-1), it is preferable that at least one of $Rt^5$ or $Rt^6$ is a hydrogen atom, and it is more preferable that both of $Rt^5$ and $Rt^6$ are hydrogen atoms.

Specific examples of the pinacol compound include benzopinacol, 1,2-dimethoxy-1,1,2,2-tetraphenylethane, 1,2-diethoxy-1,1,2,2-tetraphenylethane, 1,2-diphenoxy-1,1,2,2-tetraphenylethane, 1,2-dimethoxy-1,1,2,2-tetra(4-methylphenyl)ethane, 1,2-diphenoxy-1,1,2,2-tetra(4-methoxyphenyl)ethane, 1,2-bis(trimethylsiloxy)-1,1,2,2-tetraphenylethane, 1,2-bis(triethylsoxy)-1,1,2,2-tetraphenylethane, 1,2-bis(t-butyldimethylsoxy)-1,1,2,2-tetraphenylethane, 1-hydroxy-2-trimethylsiloxy-1,1,2,2-tetraphenylethane, 1-hydroxy-2-triethylsiloxy-1,1,2,2-tetraphenylethane, and 1-hydroxy-2-t-butyldimethylsoxy-1,1,2,2-tetraphenylethane.

Examples of the α-hydroxyacetophenone compound include compounds represented by Formula (T-11).

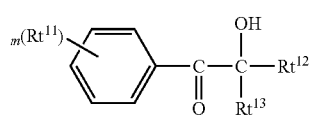

Formula (T-11)

In the formula, $Rt^{11}$ represents a substituent, $Rt^{12}$ and $Rt^{13}$ each independently represent a hydrogen atom or a substituent, $Rt^{12}$ and $Rt^{13}$ may be bonded to each other to form a ring, and m represents an integer of 0 to 4.

Examples of the substituent represented by $Rt^{11}$ include the above-mentioned substituents, and the substituent is preferably an alkyl group or an alkoxy group. The alkyl group and the alkoxy group may be unsubstituted or may have a substituent. Examples of the substituent include a hydroxy group.

$Rt^{12}$ and $Rt^{13}$ each independently represent a hydrogen atom or a substituent. Examples of the substituent include the above-mentioned substituents, and the substituent is preferably an alkyl group or an aryl group. In addition, $Rt^{12}$ and $Rt^{13}$ may be bonded to each other to form a ring (preferably a ring having 4 to 8 carbon atoms, and more preferably an aliphatic ring having 4 to 8 carbon atoms).

Specific examples of the α-hydroxyacetophenone compound include 1-hydroxy-cyclohexyl-phenyl-ketone and 1-[4-(2-hydroxyethoxy)-phenyl]-2-hydroxy-2-methyl-1-propan-1-one. Examples of a commercially available product of the α-hydroxyacetophenone compound include IRGACURE-184 and IRGACURE-2959 (both manufactured by BASF).

The content of the thermal-radical polymerization initiator is preferably 0.1% to 30% by mass, more preferably 0.5% to 20% by mass, and still more preferably 1% to 10% by mass, with respect to the total solid content of the coloring composition.

In addition, the content of the thermal-radical polymerization initiator is preferably 10 to 1,000 parts by mass with respect to 100 parts by mass of the photo-radical polymerization initiator. The upper limit is more preferably 500 parts by mass or less, still more preferably 300 parts by mass or less, and even more preferably 200 parts by mass or less. The lower limit is more preferably 30 parts by mass or more, still more preferably 40 parts by mass or more, and even more preferably 50 parts by mass or more.

In addition, the content of the thermal-radical polymerization initiator is preferably 1 to 200 parts by mass with respect to 100 parts by mass of the radically polymerizable compound. The upper limit is more preferably 180 parts by mass or less, still more preferably 150 parts by mass or less, and even more preferably 100 parts by mass or less. The lower limit is more preferably 5 parts by mass or more, still more preferably 10 parts by mass or more, and even more preferably 15 parts by mass or more.

The coloring composition of the embodiment of the present invention may include only one kind or two or more kinds of the thermal-radical polymerization initiators. In a case of including two or more kinds of the thermal-radical polymerization initiators, the total amount thereof is preferably within the above-mentioned range.

《Compound Having Epoxy Group》

The coloring composition of the embodiment of the present invention preferably contains a compound having an epoxy group (hereinafter also referred to as an epoxy compound). According to this aspect, it is easy to form a cured film having more excellent moisture resistance. As the epoxy compound, a compound having two or more epoxy groups per molecule is preferable. The upper limit of the epoxy group is preferably 100 or less, more preferably 10 or less, and still more preferably 5 or less.

The epoxy compound is preferably a compound which has a structure having an aromatic ring and/or an aliphatic ring, and more preferably a compound which has a structure having an aliphatic ring. The epoxy group in the epoxy compound is preferably bonded to the aromatic ring and/or the aliphatic ring via a single bond or a linking group. Examples of the linking group include an alkylene group, an arylene group, —NR'— (R' represents a hydrogen atom, an alkyl group which may have a substituent, or an aryl group which may have a substituent, and is preferably the hydrogen atom), —$SO_2$—, —CO—, —COO—, —OCO—, —O—, —S—, and a group formed by combination thereof.

In a case where the epoxy compound is a compound having an aliphatic ring, it is preferable that the epoxy group is directly bonded (single bond) to the aliphatic ring. In a case where the epoxy compound is a compound having an aromatic ring, it is preferable that the epoxy group is bonded to the aromatic ring via a linking group. The linking group is preferably an alkylene group or a group formed by combination of an alkylene group and —O—.

In addition, as the epoxy compound, a compound which has a structure having two or more aromatic rings linked with a hydrocarbon group can also be used. The hydrocarbon group is preferably an alkylene group having 1 to 6 carbon atoms. The epoxy group is preferably linked via the linking group.

The epoxy equivalent (=the molecular weight of a compound having the epoxy group/the number of epoxy groups) of the epoxy compound is preferably 500 g/eq or less, more preferably 100 to 400 g/eq, and still more preferably 100 to 300 g/eq.

The epoxy compound may be either a low-molecular-weight compound (for example, a molecular weight of less than 1,000) or a high-molecular-weight compound (macromolecule) (for example, a molecular weight of 1,000 or more, and in a case of a polymer, a weight-average molecular weight of 1,000 or more). The molecular weight (in a case of the polymer, the weight-average molecular weight) of the epoxy compound is preferably 200 to 100,000 and more preferably 500 to 50,000. The upper limit of the molecular weight (in a case of the polymer, the weight-average molecular weight) of the epoxy compound is preferably 3,000 or less, more preferably 2,000 or less, and still more preferably 1,500 or less.

As the epoxy compound, the compounds described in paragraph Nos. 0034 to 0036 of JP2013-011869A, paragraph Nos. 0147 to 0156 of JP2014-043556A, and paragraph Nos. 0085 to 0092 of JP2014-089408A can also be used. The contents of the publications are incorporated herein by reference. With regard to a commercially available product of the epoxy compound, examples of a bisphenol A type epoxy resin include jER825, jER827, jER828, jER834, jER1001, jER1002, jER1003, jER1055, jER1007, jER1009, and jER1010 (all manufactured by Mitsubishi Chemical Corporation), and EPICLON 860, EPICLON 1050, EPICLON 1051, and EPICLON 1055 (all manufactured by DIC Corporation). Examples of a bisphenol F type epoxy resin include jER806, jER807, jER4004, jER4005, jER4007, and jER4010 (all manufactured by Mitsubishi Chemical Corporation), EPICLON 830 and EPICLON 835 (both manufactured by DIC Corporation), and LCE-21 and RE-602S (both manufactured by Nippon Kayaku Co., Ltd.). Examples of a phenol novolac type epoxy resin include jER152, jER154, jER157S70, and jER157S65 (all manufactured by Mitsubishi Chemical Corporation), and EPICLON N-740, EPICLON N-770, and EPICLON N-775 (all manufactured by DIC Corporation). Examples of a cresol novolac type epoxy resin include EPICLON N-660, EPICLON N-665, EPICLON N-670, EPICLON N-673, EPICLON N-680, EPICLON N-690, and EPICLON N-695 (all manufactured by DIC Corporation), and EOCN-1020 (manufactured by Nippon Kayaku Co., Ltd.). Examples of an aliphatic epoxy resin include ADEKA RESIN EP-4080S, ADEKA RESIN EP-4085S, and ADEKA RESIN EP-4088S (all manufactured by ADEKA Corporation), CELLOXIDE 2021P, CELLOXIDE 2081, CELLOXIDE 2083, CELLOXIDE 2085, EHPE 3150, EPOLEAD PB 3600, and EPOLEAD PB 4700 (all manufactured by Daicel Corporation), and DENACOL EX-212L, DENACOL EX-214L, DENACOL EX-216L, DENACOL EX-321L, and DENACOL EX-850L (all manufactured by Nagase ChemteX Corporation). Other examples of the commercially available product include ADEKA RESIN EP-4000S, ADEKA RESIN EP-4003S, ADEKA RESIN EP-4010S, and ADEKA RESIN EP-4011S (all manufactured by ADEKA Corporation), NC-2000, NC-3000, NC-7300, XD-1000, EPPN-501, and EPPN-502 (all manufactured by ADEKA Corporation), and jER1031S (manufactured by Mitsubishi Chemical Corporation).

In a case where the coloring composition of the embodiment of the present invention contains an epoxy compound, the content of the epoxy compound is preferably 0.1% to 40% by mass with respect to the total solid content of the coloring composition. The lower limit is, for example, more preferably 0.5% by mass or more, and still more preferably 1% by mass or more. The upper limit is, for example, more preferably 30% by mass or less, and still more preferably 20% by mass or less. These epoxy compounds may be used singly or in combination of two or more kinds thereof. In a case where the epoxy compounds are used in combination of two or more kinds thereof, the total amount thereof is preferably within the range.

In addition, the content of the epoxy compound is preferably 5 to 100 parts by mass with respect to 100 parts by mass of the radically polymerizable compound. The upper limit is preferably 100 parts by mass or less, more preferably 70 parts by mass or less, and still more preferably 50 parts by mass or less. The lower limit is preferably 5 parts by mass or more, more preferably 8 parts by mass or more, and still more preferably 10 parts by mass or more. In a case where the ratio of the epoxy compound and the radically polymerizable compound is within the above range, more excellent moisture resistance can be obtained.

«Resin»

The coloring composition of the embodiment of the present invention preferably includes a resin. The resin is blended in, for example, an application for dispersing particles such as a pigment in the composition or an application as a binder. Incidentally, a resin which is used for dispersing particles such as a pigment in the composition is also referred to as a dispersant. However, such applications of the resin are only exemplary, and the resin can also be used for other purposes, in addition to such uses.

The weight-average molecular weight (Mw) of the resin is preferably 2,000 to 2,000,000. The upper limit is more preferably 1,000,000 or less and still more preferably 500,000 or less. The lower limit is more preferably 3,000 or more and still more preferably 5,000 or more.

The content of the resin in the coloring composition of the embodiment of the present invention is preferably 1% to 80% by mass with respect to the total solid content of the coloring composition. The lower limit is more preferably 10% by mass or more and still more preferably 20% by mass or more. The upper limit is more preferably 60% by mass or less and still more preferably 40% by mass or less.

(Dispersant)

The coloring composition of the embodiment of the present invention preferably includes a dispersant as a resin. Examples of the dispersant include polymer dispersants (for example, polyamide amine or a salt thereof, polycarboxylic acid or a salt thereof, high molecular weight unsaturated acid ester, modified polyurethane, modified polyester, modified poly(meth)acrylate, a (meth)acrylic copolymer, or a naphthalene sulfonic acid formalin condensate), polyoxyethylene alkylphosphate ester, polyoxyethylene alkyl amine, or alkanolamine.

The polymer dispersant can be further classified into a linear polymer, a terminal-modified polymer, a graft polymer, and a block polymer according to the structure thereof. The polymeric dispersant adsorbs on a surface of a pigment and acts to prevent reaggregation. Therefore, examples of a preferred structure of the polymer dispersant include a terminal-modified polymer, a graft polymer, and a block polymer, each of which has an anchor site for adsorbing on the pigment surface. In addition, dispersants described in paragraph Nos. 0028 to 0124 of JP2011-070156A or dispersants described in JP2007-277514A are preferably used. The contents of the publications are incorporated herein by reference.

In the present invention, the resin as the dispersant is preferably a resin including a repeating unit having a graft chain as a side chain (hereinafter also referred to as a graft resin). According to this aspect, the dispersibility of the pigment can be further improved. Here, the graft chain means a polymer chain branched from the main chain of the repeating unit. The length of the graft chain is not particularly limited, and in a case where the graft chain gets longer, a steric repulsion effect is enhanced, and thus, the dispersibility of the pigment or the like can be increased. In the graft chain, the number of atoms excluding the hydrogen atoms is preferably 40 to 10,000, the number of atoms excluding the hydrogen atoms is more preferably 50 to 2,000, and the number of atoms excluding the hydrogen atoms is still more preferably 60 to 500.

The graft chain preferably includes at least one structure selected from a polyester chain, a polyether chain, a poly(meth)acryl chain, a polyurethane chain, a polyurea chain, or a polyamide chain, more preferably includes at least one structure selected from a polyester chain, a polyether chain, or a poly(meth)acryl chain, and still more preferably includes a polyester chain.

A terminal structure of the graft chain is not particularly limited. The terminal structure of the graft chain may be a hydrogen atom or a substituent. Examples of the substituent include an alkyl group, an aryl group, a heteroaryl group, an alkoxy group, an aryloxy group, a heteroaryloxy group, an alkylthioether group, an arylthioether group, and a heteroarylthioether group. Among those, from the viewpoint of improvement of the dispersibility of the pigment or the like, a group having a steric repulsion effect is preferable, and an alkyl group or alkoxy group having 5 to 24 carbon atoms is preferable. The alkyl group and the alkoxy group may be any of linear, branched, and cyclic forms, and are preferably linear or branched.

An example of the graft resin includes a resin having a repeating unit represented by any one of the following Formulae (1) to (4).

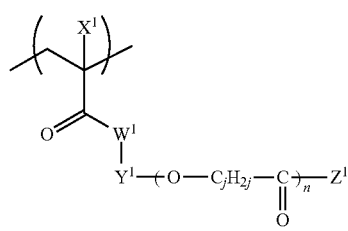

(1)

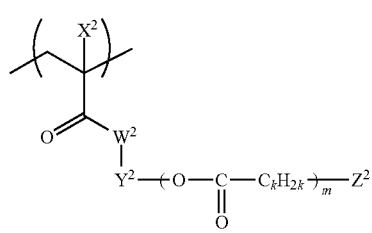

(2)

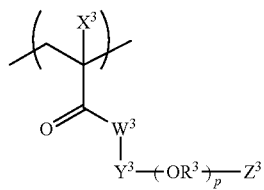

(3)

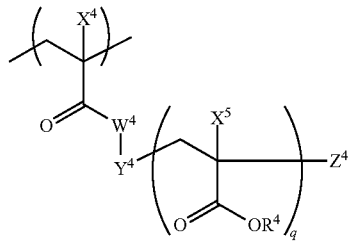

(4)

In Formulae (1) to (4), $W^1$, $W^2$, $W^3$, and $W^4$ each independently represent an oxygen atom or NH, $X^1$, $X^2$, $X^3$, $X^4$, and $X^5$ each independently represent a hydrogen atom, a monovalent organic group, or a halogen atom, $Y^1$, $Y^2$, $Y^3$, and $Y^4$ each independently represent a divalent linking group, $Z^1$, $Z^2$, $Z^3$, and $Z^4$ each independently represent a monovalent organic group, $R^3$ represents an alkylene group, $R^4$ represents a hydrogen atom or a monovalent organic group, n, m, p, and q each independently represent an integer of 1 to 500, and j and k each independently represent an integer of 2 to 8. In Formula (3), in a case where p is 2 to 500, a plurality of $R^3$'s may be the same or different from each other. In Formula (4), in a case where q is 2 to 500, a plurality of $X^5$'s and $R^4$'s may be the same or different from each other.

$W^1$, $W^2$, $W^3$, and $W^4$ are preferably an oxygen atom. $X^1$, $X^2$, $X^3$, $X^4$, and $X^5$ are preferably a hydrogen atom or an alkyl group having 1 to 12 carbon atoms, more preferably a hydrogen atom or a methyl group, and particularly preferably a methyl group. $Y^1$, $Y^2$, $Y^3$, and $Y^4$ each independently represent a divalent linking group and the linking group is not particularly restricted in the structure. Examples of the divalent linking group include an alkylene group (preferably an alkylene group having 1 to 12 carbon atoms), an arylene group (preferably an arylene group having 6 to 20 carbon atoms), —NH—, —SO—, —SO$_2$—, —CO—, —O—, —COO—, —OCO—, —S—, and a group formed by combination of two or more of these groups. A structure of a monovalent organic group represented by $Z^1$, $Z^2$, $Z^3$, and $Z^4$ is not particularly limited, and specific examples thereof include an alkyl group, a hydroxyl group, an alkoxy group, an aryloxy group, a heteroaryloxy group, an alkylthioether group, an arylthioether group, a heteroarylthioether group, and an amino group. From the viewpoint of improving dispersibility, the organic group represented by $Z^1$, $Z^2$, $Z^3$, and $Z^4$ preferably has a steric repulsion effect, is each independently preferably an alkyl group or an alkoxy group having 5 to 24 carbon atoms, and in particular, still more preferably a branched alkyl group having 5 to 24 carbon atoms, a cyclic alkyl group having 5 to 24 carbon atoms, or an alkoxy group having 5 to 24 carbon atoms. An alkyl group included in the alkoxy group may be any of linear, branched chain, or cyclic forms.

In Formulae (1) to (4), n, m, p, and q each independently represent an integer of 1 to 500. In addition, in Formulae (1) and (2), j and k each independently represent an integer of 2 to 8. j and k in Formulae (1) and (2) are preferably an integer of 4 to 6 and most preferably 5 from the viewpoint of dispersion stability and developability.

In Formula (3), $R^3$ represents an alkylene group, and an alkylene group having 1 to 10 carbon atoms is preferable and an alkylene group having 2 or 3 carbon atoms is more preferable. In a case where p is 2 to 500, a plurality of $R^3$'s may be the same or different from each other.

In Formula (4), $R^4$ represents a hydrogen atom or a monovalent organic group. The monovalent organic group is not particularly limited in the structure. Examples of the monovalent organic group include a hydrogen atom, an alkyl group, an aryl group, and a heteroaryl group, and the hydrogen atom and the alkyl group is preferable. In Formula (4), in a case where q is 2 to 500, a plurality of $X^5$'s and $R^4$'s may independently be the same or different from each other.

Examples of the graft resin include a resin having the following structure. In addition, with regard to details of the graft resin, reference can be made to the description in paragraph Nos. 0025 to 0094 of JP2012-255128A, and the contents thereof are incorporated herein by reference.

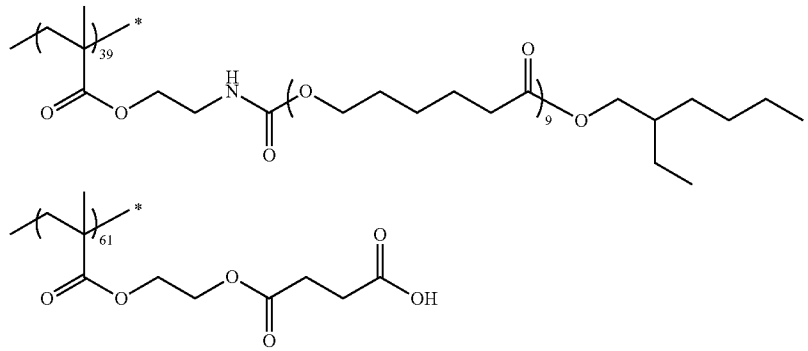

In addition, in the present invention, a resin including a nitrogen atom in the main chain is preferably used. The resin including a nitrogen atom in the main chain (hereinafter, also referred to as oligoimine-based resin) is preferable to include at least one repeating unit having a nitrogen atom selected from a poly(lower alkyleneimine)-based repeating unit, a polyallylamine-based repeating unit, a polydiallylamine-based repeating unit, a metaxylene diamine-epichlorohydrin polycondensate-based repeating unit, or a polyvinylamine-based repeating unit.

In addition, as an oligoimine-based resin, a resin which has a repeating unit having a partial structure X composed of a functional group with pKa of 14 or less and a repeating unit having a side chain including an oligomer chain or a polymer chain Y having 40 to 10,000 atoms is preferable.

For example, an oligoimine-based resin is preferably a resin including a repeating unit represented by Formula (I-1), a repeating unit represented by Formula (I-2), and/or a repeating unit represented by Formula (I-2a).

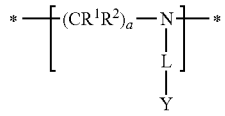

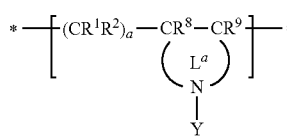

$R^1$ and $R^2$ each independently represent a hydrogen atom, a halogen atom, or an alkyl group (preferably 1 to 6 carbon atoms). Each a independently represents an integer of 1 to 5. * represents a linking site between repeating units.

$R^8$ and $R^9$ are groups having the same definition as $R^1$.

L is a linking group which consists of a single bond, an alkylene group (preferably 1 to 6 carbon atoms), an alkenylene group (preferably 2 to 6 carbon atoms), an arylene group (preferably 6 to 24 carbon atoms), a heteroarylene group (preferably 1 to 6 carbon atoms), an imino group (preferably 0 to 6 carbon atoms), an ether group, a thioether group, a carbonyl group, or a combination thereof. Among those, a single bond or —$CR^5R^6$—$NR^7$— (an imino group is located on the X or Y side) is preferable. Here, $R^5$ and $R^6$ each independently represent a hydrogen atom, a hydrogen atom, or an alkyl group (preferably 1 to 6 carbon atoms). $R^7$ represents a hydrogen atom or an alkyl group having 1 to 6 carbon atoms.

$L^a$ is a structural site that forms a ring structure together with $CR^8CR^9$, and N, and is preferably a structural site forming a non-aromatic heterocycle having 3 to 7 carbon atoms together with the carbon atom of $CR^8CR^9$. Furthermore, $L^a$ is preferably a structural site forming a five- to seven-membered non-aromatic heterocycle together with the carbon atom of $CR^8CR^9$ and N (nitrogen atom), more preferably a structural site forming five-membered non-aromatic heterocycle, and particularly preferably a structural site forming pyrrolidine. Furthermore, the structural site may have a substituent such as an alkyl group.

X represents a group having a functional group with pKa of 14 or less.

Y represents a side chain having 40 to 10,000 atoms.

Furthermore, an oligoimine-based resin may contain one or more repeating units selected from the repeating units represented by Formulae (I-3), (I-4), and (I-5), as a copolymerization component. By the oligoimine-based resin containing the repeating units, dispersibility of the pigment can be improved.

(I-3)
(I-4)
(I-5)

R¹, R², R⁸, R⁹, L, Lᵃ, a, and * have the same definitions defined in Formulae (I-1), (I-2), and (I-2a). Ya represents a side chain which has an anionic group having 40 to 10,000 atoms. A repeating unit represented by Formula (I-3) can be formed by adding an oligomer or polymer which has a group reacting with an amine to form a salt to a resin which has a primary or secondary amino group in the main chain and then reacting with each other.

With regard to the oligoimine-based resin, reference can be made to the description in paragraph Nos. 0102 to 0166 of JP2012-255128A, and the contents thereof are incorporated herein by reference. Specific examples of the oligoimine-based resin include resins shown below. In addition, the resins described in paragraph Nos. 0168 to 0174 of JP2012-255128A can be used.

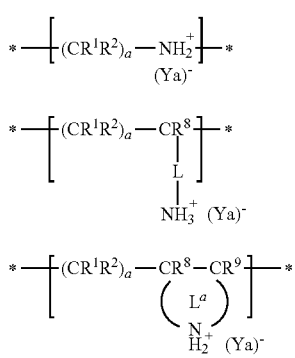

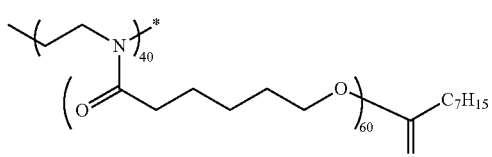

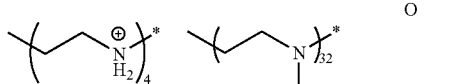

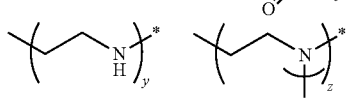

(y + z) = 24

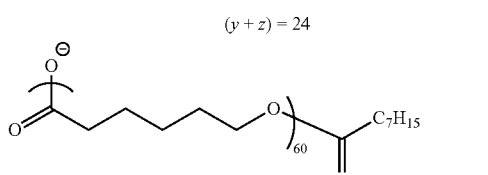

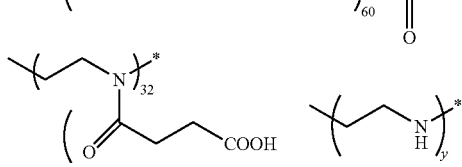

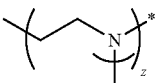

(y + z) = 24

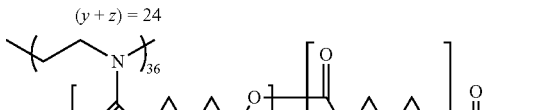

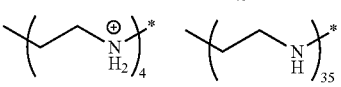

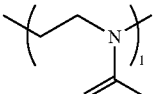

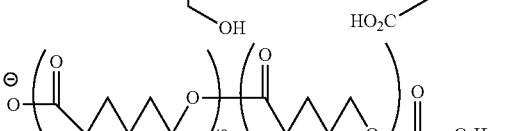

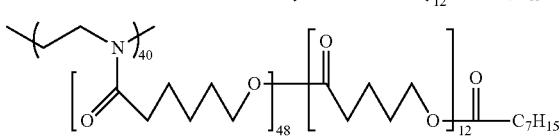

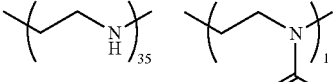

A commercially available product can also be used as the resin for the dispersant. For example, a product described in paragraph No. 0129 of JP2012-137564A can be used as the dispersant. An example thereof includes Disperbyk-111 (manufactured by BYK-Chemie). The resin demonstrated as the dispersant can also be used for other applications in addition to the dispersant. For example, the resin can also be used for a binder.

A content of the dispersant is preferably 1 to 200 parts by mass with respect to 100 parts by mass of the pigment. The lower limit is more preferably 5 parts by mass or more and still more preferably 10 parts by mass or more. The upper limit is more preferably 150 parts by mass or less and still more preferably 100 parts by mass or less.

(Alkali-Soluble Resin)

The coloring composition of the embodiment of the present invention preferably contains an alkali-soluble resin as a resin. By containing the alkali-soluble resin, developability is improved. The alkali-soluble resin can also be used as a dispersant or a binder.

The alkali-soluble resin can be appropriately selected from resins having a group promoting an alkali dissolution. Examples of the group promoting an alkali dissolution (hereinafter also referred to as an acid group) include a carboxyl group, a phosphoric acid group, a sulfo group, and a phenolic hydroxy group, and preferably the carboxyl group. The acid groups included in the alkali-soluble resin may be of one kind or two or more kinds thereof.

The weight-average molecular weight (Mw) of the alkali-soluble resin is preferably 5,000 to 100,000. In addition, the number-average molecular weight (Mn) of the alkali-soluble resin is preferably 1,000 to 20,000.

As the alkali-soluble resin, from the viewpoint of heat resistance, a polyhydroxystyrene-based resin, a polysiloxane-based resin, an acrylic-based resin, an acrylamide-based resin, or an acrylic/acrylamide copolymer resin is preferable. In addition, from the viewpoint of suppressing developability, an acrylic-based resin, an acrylamide-based resin, or an acrylic/acrylamide copolymer resin is preferable.

The alkali-soluble resin is preferably a polymer having a carboxyl group in the side chain. Examples thereof include copolymers having a repeating unit derived from a monomer such as a methacrylic acid, an acrylic acid, an itaconic acid, a crotonic acid, a maleic acid, a 2-carboxyethyl(meth)acrylic acid, a vinylbenzoic acid, and a partially esterified maleic acid, alkali-soluble phenol resins such as a novolac type resin, an acidic cellulose derivative having a carboxyl group in the side chain, and a polymer obtained by adding an acid anhydride to a polymer having a hydroxy group. In particular, a copolymer of a (meth)acrylic acid and another monomer copolymerizable therewith is suitable as the alkali-soluble resin. Examples of another monomer copolymerizable with the (meth)acrylic acid include alkyl (meth)acrylate, aryl (meth)acrylate, and a vinyl compound. Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, cyclohexyl (meth)acrylate, glycidyl methacrylate, and tetrahydrofurfuryl methacrylate. Examples of the vinyl compound include styrene, α-methylstyrene, vinyltoluene, acrylonitrile, vinyl acetate, N-vinylpyrrolidone, a polystyrene macromonomer, and a polymethyl methacrylate macromonomer. Further, examples of other monomer include the N-position-substituted maleimide monomers described in JP1998-300922A (JP-H10-300922A), such as N-phenylmaleimide and N-cyclohexylmaleimide. Such other monomers copolymerizable with (meth)acrylic acids may be of one kind or of two or more kinds thereof.

As the alkali-soluble resin, a benzyl (meth)acrylate/(meth)acrylic acid copolymer, a benzyl (meth)acrylate/(meth)acrylic acid/2-hydroxyethyl (meth)acrylate copolymer, or a multicomponent copolymer including benzyl (meth)acrylate/(meth)acrylic acid/other monomers can be preferably used. Further, a copolymer obtained by copolymerizing 2-hydroxyethyl (meth)acrylate and other monomers, the 2-hydroxypropyl (meth)acrylate/polystyrene macromonomer/benzyl methacrylate/methacrylic acid copolymer described in JP1995-140654A (JP-H07-140654A), a 2-hydroxy-3-phenoxypropylacrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, a 2-hydroxyethyl methacrylate/polystyrene macromonomer/benzyl methacrylate/methacrylic acid copolymer, and the like can also be preferably used. Furthermore, as a commercially available product, for example, FF-426 (manufactured by Fujikura Kasei Co., Ltd.) can also be used.

An alkali-soluble resin having a polymerizable group can also be used as the alkali-soluble resin. Examples of the polymerizable group include a (meth)allyl group and a (meth)acryloyl group. An alkali-soluble resin having a polymerizable group is preferably an alkali-soluble resin having a polymerizable group in the side chain. Specific examples of the alkali-soluble resin having a polymerizable group include a resin having the following structure. Examples of a commercially available product of the alkali-soluble resin having a polymerizable group include Dianal NR Series (manufactured by Mitsubishi Rayon Co., Ltd.), Photomer 6173 (polyurethane acrylate oligomer containing carboxyl group, manufactured by Diamond Shamrock Corp.), Viscoat R-264 and KS Resist 106 (all manufactured by Osaka Organic Chemical Industry Ltd.), Cyclomer P series (for example, ACA230AA) and Placcel CF 200 series (all manufactured by Daicel Corporation), Ebecryl 3800 (manufactured by Daicel UCB Company, Ltd.), Acrycure RD-F8 (manufactured by Nippon Shokubai Co., Ltd.), and DP-1305 (manufactured by Fuji Fine Chemicals). In the present specification, the alkali-soluble resin having a polymerizable group is defined as a polymerizable compound.

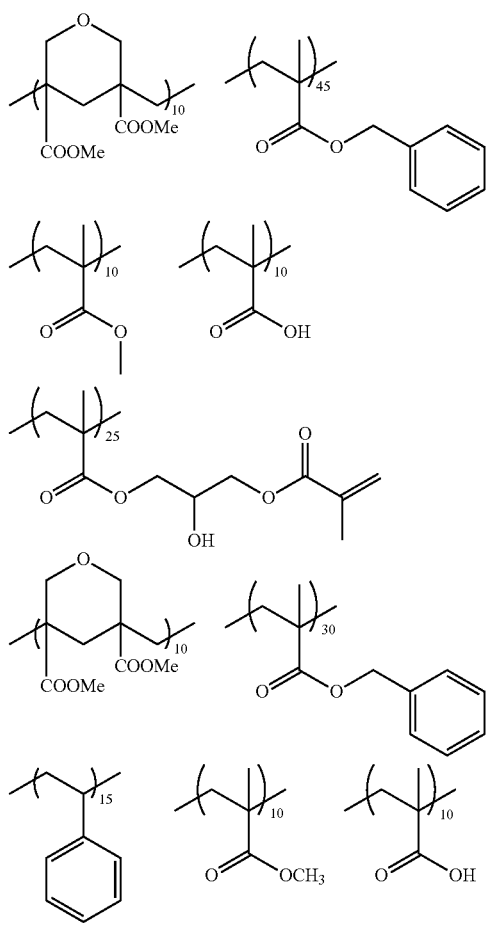

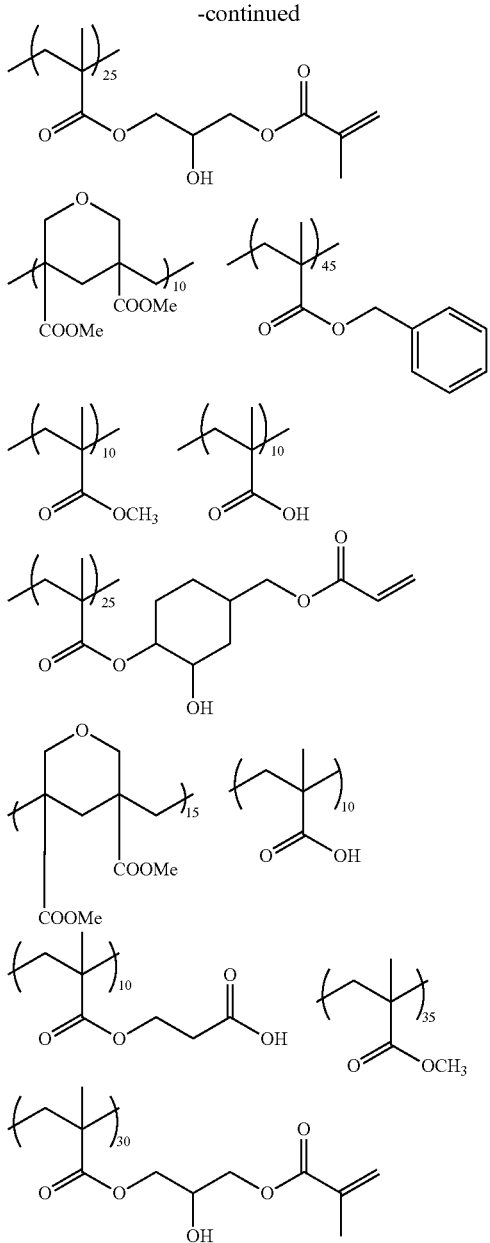

The alkali-soluble resin is preferable to include a polymer obtained by polymerizing monomer components including at least one compound (hereinafter, in some case, the compound is also referred to as an "ether dimer") selected from compounds represented by following Formula (ED1) or compounds represented by Formula (1) of JP2010-168539A.

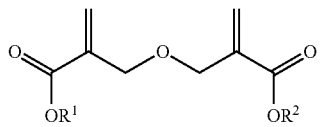

(ED1)

In Formula (ED1), $R^1$ and $R^2$ each independently represent a hydrogen atom or a hydrocarbon group having 1 to 25 carbon atoms, which may have a substituent.

With regard to the specific examples of the ether dimer, reference can be made to paragraph No. 0317 of JP2013-029760A, and the contents thereof are incorporated herein by reference. The ether dimers may be used singly or in combination of two or more kinds thereof.

The alkali-soluble resin may include a repeating unit derived from a compound represented by Formula (X).

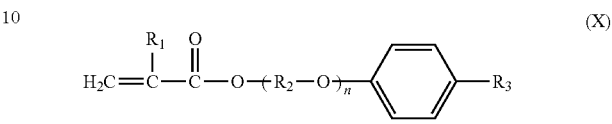

(X)

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms, which may include a benzene ring. n represents an integer of 1 to 15.

In Formula (X), the number of carbon atoms of the alkylene group represented by $R_2$ is preferably 2 to 3. In addition, the number of carbon atoms of the alkyl group represented by $R_3$ is preferably 1 to 10. The alkyl group represented by $R_3$ may include a benzene ring. Examples of the alkyl group including a benzene ring represented by $R_3$ include a benzyl group, a 2-phenyl (iso)propyl group and the like.

With regard to the alkali-soluble resin, reference can be made to the description in paragraph Nos. 0558 to 0571 of JP2012-208494A (paragraph Nos. 0685 to 0700 of the corresponding US2012/0235099A), and the contents thereof are incorporated herein by reference. In addition, a copolymer (B) described in paragraph Nos. 0029 to 0063 of JP2012-032767A and the alkali-soluble resins used in Examples, binder resins described in paragraph Nos. 0088 to 0098 of JP2012-208474A and binder resins used in Examples, binder resins described in paragraph Nos. 0022 to 0032 of JP2012-137531A and binder resins used in Examples, binder resins described in paragraph Nos. 0132 to 0143 of JP2013-024934A and binder resins used in Examples, binder resins described in paragraph Nos. 0092 to 0098 of JP2011-242752A and Examples, and binder resins described in paragraph Nos. 0030 to 0072 of JP2012-032770A can also be used. The contents of the publications are incorporated herein by reference.

An acid value of the alkali-soluble resin is preferably 30 to 500 mgKOH/g. The lower limit is more preferably 50 mgKOH/g or more and still more preferably 70 mgKOH/g or more. The upper limit is more preferably 400 mgKOH/g or less, still more preferably 200 mgKOH/g or less, even still more preferably 150 mgKOH/g or less, and particularly preferably 120 mgKOH/g or less.

The content of the alkali-soluble resin is preferably 1% to 80% by mass with respect to the total solid content of the coloring composition. The lower limit is more preferably 10% by mass or more and still more preferably 20% by mass or more. The upper limit is more preferably 60% by mass or less and still more preferably 40% by mass or less. The coloring composition of the embodiment of the present invention may include only one kind or two or more kinds of the alkali-soluble resin. In a case where two or more kinds of the alkali-soluble resins are included, the total amount thereof is preferably within the above-mentioned range.

«Solvent»

The coloring composition of the embodiment of the present invention preferably contains a solvent. The solvent is preferably an organic solvent. The solvent is not particularly limited as long as it satisfies the solubility of the respective components or the coatability of the coloring composition.

Examples of the organic solvent include the following organic solvents. Examples of esters include ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, alkyl alkyloxyacetate esters (for example, methyl alkyloxyacetate, ethyl alkyloxyacetate, and butyl alkyloxyacetate (for example, methyl methoxyacetate, ethyl methoxyacetate, butyl methoxyacetate, methyl ethoxyacetate, and ethyl ethoxyacetate)), alkyl 3-alkyloxypropionate esters (for example, methyl 3-alkyloxypropionate and ethyl 3-alkyloxypropionate (for example, methyl 3-methoxypropionate, ethyl 3-methoxypropionate, methyl 3-ethoxypropionate, and ethyl 3-ethoxypropionate)), alkyl 2-alkyloxypropionate esters (for example, methyl 2-alkyloxypropionate, ethyl 2-alkyloxypropionate, and propyl 2-alkyloxypropionate (for example, methyl 2-methoxypropionate, ethyl 2-methoxypropionate, propyl 2-methoxypropionate, methyl 2-ethoxypropionate, and ethyl 2-ethoxypropionate)), methyl 2-alkyloxy-2-methyl propionate and ethyl 2-alkyloxy-2-methyl propionate (for example, methyl 2-methoxy-2-methyl propionate and ethyl 2-ethoxy-2-methyl propionate), methyl pyruvate, ethyl pyruvate, propyl pyruvate, methyl acetoacetate, ethyl acetoacetate, methyl 2-oxobutanoate, and ethyl 2-oxobutanoate. Examples of ethers include diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate. Examples of the ketones include methyl ethyl ketone, cyclohexanone, cyclopentanone, 2-heptanone, and 3-heptanone. Suitable examples of the aromatic hydrocarbons include toluene and xylene. In addition, 3-methoxy-N,N-dimethylpropanamide or 3-butoxy-N, N-dimethylpropanamide is also preferable from the viewpoint of enhancing the solubility. The organic solvents may be used singly or in combination of two or more kinds thereof. However, it is preferable in some cases to reduce aromatic hydrocarbons (benzene, toluene, xylene, ethylbenzene, and the like) (for example, the amount can be set to 50 ppm (parts per million) by mass or less, 10 ppm by mass or less, or 1 ppm by mass or less with respect to the total amount of the organic solvent) as a solvent for a reason such as an environmental aspect.

The organic solvents may be used singly or in combination of two or more kinds thereof. In a case where the organic solvents are used in combination of two or more kinds thereof, the solvent is particularly preferably a mixed solution formed of two or more kinds selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol monomethyl ether acetate.

In the present invention, a solvent having a small metal content is preferably used as the solvent. For example, the metal content in the solvent is preferably 10 ppb (parts per billion) by mass or less. A solvent in which the metal content is at a level of ppt (parts per trillion) by mass may be used as desired, and such a high-purity solvent is provided by, for example, Toyo Kasei Kogyo Co., Ltd. (The Chemical Daily, Nov. 13, 2015).

Examples of a method of removing impurities such as a metal from the solvent include distillation (for example, molecular distillation and thin-film distillation) and filtration using a filter. The filter pore size of a filter used for the filtration is preferably 10 μm or less, more preferably 5 μm or less, and still more preferably 3 μm or less. As a material of the filter, polytetrafluoroethylene, polyethylene, or nylon is preferable.

The solvent may include isomers (compounds having the same number of atoms and different structures). In addition, only one kind of isomers or a plurality of isomers may be included.

In the present invention, the organic solvent preferably has the content of peroxides of 0.8 mmol/L or less, and more preferably, it does not substantially include peroxides.

The content of the solvent is preferably an amount such that the total solid content of the coloring composition is 5% to 80% by mass. The lower limit is more preferably an amount such that the total solid content of the coloring composition is 10% by mass or more. The upper limit is an amount such that the total solid content of the coloring composition is preferably 60% by mass or less, more preferably 50% by mass or less, and still more preferably 40% by mass or less.

《Curing Accelerator》

The coloring composition of the embodiment of the present invention may include a curing accelerator for the purpose of improving the hardness of a pattern or lowering a curing temperature. Examples of the curing accelerator include a thiol compound.

Examples of the thiol compound include a polyfunctional thiol compound having two or more mercapto groups in a molecule thereof. The polyfunctional thiol compound may also be added for the purpose of alleviating problems in stability, smell, developability, adhesiveness, or the like. The polyfunctional thiol compound is preferably a secondary alkanethiol and more preferably a compound having a structure represented by Formula (T1).

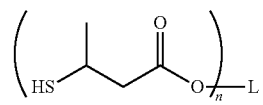

Formula (T1)

(In Formula (T1), n represents an integer of 2 to 4, and L represents a divalent to tetravalent linking group.)

In Formula (T1), it is preferable that L is an aliphatic group having 2 to 12 carbon atoms. In Formula (T1), it is more preferable that n is 2 and L is an alkylene group having 2 to 12 carbon atoms. Specific examples of the polyfunctional thiol compounds include compounds represented by Structural Formulae (T2) to (T4), and the compound represented by Formula (T2) is preferable. These thiol compounds can be used singly or in combination of two or more kinds thereof.

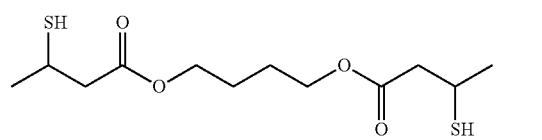

(T2)

-continued

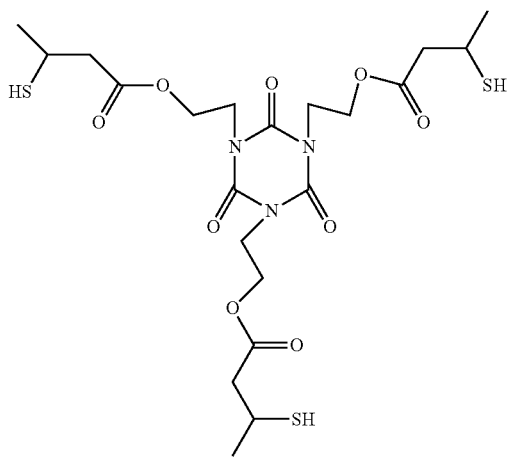
(T3)

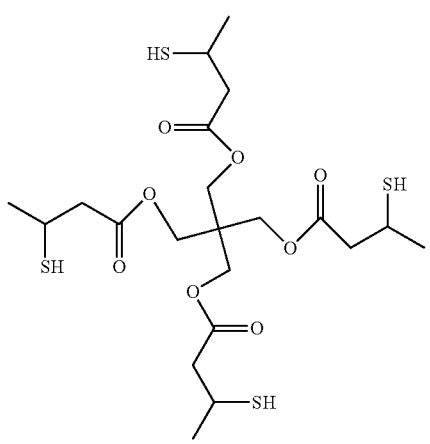
(T4)

Moreover, as the curing accelerator, a methylol-based compound (for example, the compounds exemplified as a crosslinking agent in paragraph No. 0246 of JP2015-034963A), amines, phosphonium salts, amidine salts, amide compounds (each of which are the curing agents described in, for example, paragraph No. 0186 of JP2013-041165A), base generators (for example, the ionic compounds described in JP2014-055114A), isocyanate compounds (for example, the compounds described in paragraph No. 0071 of JP2012-150180A), alkoxysilane compounds (for example, the alkoxysilane compounds having epoxy groups, described in JP2011-253054A), onium salt compounds (for example, the compounds exemplified as an acid generator in paragraph No. 0216 of JP2015-034963A, and the compounds described in JP2009-180949A), or the like can be used.

In a case where the coloring composition of the embodiment of the present invention contains a curing accelerator, the content of the curing accelerator is preferably 0.3% to 8.9% by mass, and more preferably 0.8% to 6.4% by mass, with respect to the total solid content of the coloring composition.

«Pigment Derivative»

The coloring composition of the embodiment of the present invention preferably contains a pigment derivative. Examples of the pigment derivative include a compound having a structure in which a part of a chromophore is substituted with an acid group, a basic group, or a phthalimidemethyl group.

Examples of a chromophore constituting the pigment derivative include a quinoline-based skeleton, a benzimidazolone-based skeleton, a diketopyrrolopyrrole-based skeleton, an azo-based skeleton, a phthalocyanine-based skeleton, an anthraquinone-based skeleton, a quinacridone-based skeleton, a dioxazine-based skeleton, a perinone-based skeleton, a perylene-based skeleton, a thioindigo-based skeleton, an isoindoline-based skeleton, an isoindolinone-based skeleton, a quinophthalone-based skeleton, a threne-based skeleton, and a metal complex-based skeleton, the quinoline-based skeleton, the benzimidazolone-based skeleton, the diketopyrrolopyrrole-based skeleton, the azo-based skeleton, the quinophthalone-based skeleton, the isoindoline-based skeleton, and the phthalocyanine-based skeleton are preferable, and the azo-based skeleton and the benzimidazolone-based skeleton are more preferable. As the acid group contained in the pigment derivative, a sulfo group or a carboxyl group is preferable and the sulfo group is more preferable. As the basic group contained in the pigment derivative, an amino group is preferable and a tertiary amino group is more preferable. With regard to specific examples of the pigment derivative, reference can be made to the description in paragraph Nos. 0162 to 0183 of JP2011-252065A, and the contents thereof are incorporated herein by reference.

In a case where the coloring composition of the embodiment of the present invention contains a pigment derivative, the content of the pigment derivative is preferably 1 to 30 parts by mass, and more preferably 3 to 20 parts by mass, with respect to 100 parts by mass of the pigment. The pigment derivative may be used singly or in combination of two or more kinds thereof.

«Surfactant»

The coloring composition of the embodiment of the present invention preferably contains a surfactant. As the surfactant, various surfactants such as a fluorine-based surfactant, a nonionic surfactant, a cationic surfactant, an anionic surfactant, and a silicone-based surfactant can be used, and the fluorine-based surfactant is preferable for a reason that coatability can be further improved.

By incorporating the fluorine-based surfactant into the coloring composition of the embodiment of the present invention, liquid characteristics in a case of preparation of a coating liquid are further improved, and thus, the evenness of coating thickness can be further improved. That is, in a case where a film is formed using the coating liquid to which a coloring composition containing the fluorine-based surfactant has been applied, the interface tension between a surface to be coated and the coating liquid is reduced to improve uniformity of the drying with respect to the film. Therefore, formation of a film with a uniform thickness which exhibits little coating unevenness can be more suitably performed.

The fluorine content in the fluorine-based surfactant is preferably 3% to 40% by mass, more preferably 5% to 30% by mass, and particularly preferably 7% to 25% by mass. The fluorine-based surfactant in which the fluorine content falls within this range is effective in terms of the evenness of the thickness of the coating film or liquid saving properties and the solubility of the surfactant in the coloring composition is also good.

Examples of the fluorine-based surfactant include MEGAFACE F171, F172, F173, F176, F177, F141, F142, F143, F144, R30, F437, F475, F479, F482, F554, and F780 (all manufactured by DIC Corporation), FLUORAD FC430, FC431, and FC171 (all manufactured by Sumitomo 3M), SURFLON S-382, SC-101, SC-103, SC-104, SC-105, SC-1068, SC-381, SC-383, and S-393, and KH-40 (all manufactured by Asahi Glass Co., Ltd.), and PF636, PF656, PF6320, PF6520, and PF7002 (all manufactured by OMNOVA). Further, as the fluorine-based surfactant, the compounds described in paragraph Nos. 0015 to 0158 of JP2015-117327A, and the compounds described in paragraph Nos. 0117 to 0132 of JP2011-132503A can be used.

As the fluorine-based surfactant, an acrylic compound, which has a molecular structure having a functional group containing a fluorine atom and in which by application of heat to the molecular structure, the functional group containing a fluorine atom is cut to volatilize a fluorine atom, can also be suitably used. Examples of the fluorine-based surfactant include MEGAFACE DS series (manufactured by DIC Corporation, The Chemical Daily, Feb. 22, 2016, Nikkei Business Daily, Feb. 23, 2016), for example, MEGA-FACE DS-21.

It is also preferable that a polymer of a fluorine atom-containing vinyl ether compound having a fluorinated alkyl group or a fluorinated alkylene ether group and a hydrophilic vinyl ether compound is used as the fluorine-based surfactant. With regard to such a fluorine-based surfactant, reference can be made to the description in JP2016-216602A, the contents of which are incorporated herein by reference.

A block polymer can also be used as the fluorine-based surfactant. Examples thereof include the compounds described in JP2011-089090A. As the fluorine-based surfactant, a fluorine-containing polymer compound including a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups) can also be preferably used. The following compounds are also exemplified as a fluorine-based surfactant for use in the present invention. In the following formula, % representing the ratio of the repeating unit is % by mole.

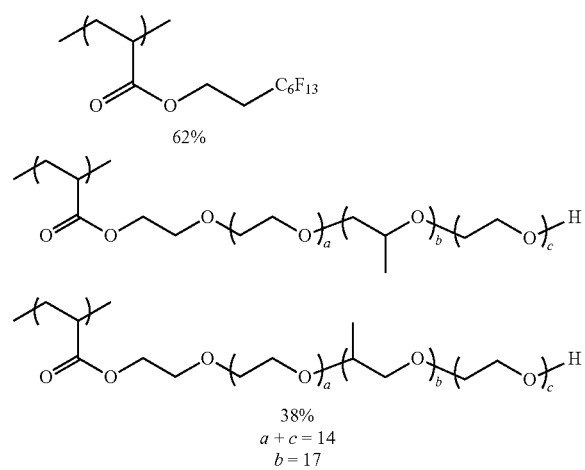

The weight-average molecular weight of the compounds is preferably 3,000 to 50,000, and is, for example, 14,000.

A fluorine-containing polymer having an ethylenically unsaturated group in a side chain can also be used as the fluorine-based surfactant. Specific examples thereof include the compounds described in paragraph Nos. 0050 to 0090 and paragraph Nos. 0289 to 0295 of JP2010-164965A. Examples of commercially available products thereof include MEGAFACE RS-101, RS-102, RS-718-K, and RS-72-K, all manufactured by DIC Corporation.

Examples of the nonionic surfactant include glycerol, trimethylolpropane, trimethylolethane, and ethoxylate and propoxylate thereof (for example, glycerol propoxylate and glycerol ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters, PLURONIC L10, L31, L61, L62, 10R5, 17R2, and 25R2 (manufactured by BASF), TETRONIC 304, 701, 704, 901, 904, and 150R1 (manufactured by BASF), SOLSPERSE 20000 (manufactured by Lubrizol Japan Ltd.), NCW-101, NCW-1001, and NCW-1002 (manufactured by Wako Pure Chemical Industries, Ltd.), PIONIN D-6112, D-6112-W, and D-6315 (manufactured by Takemoto Oil & Fat Co., Ltd.), and OLFINE E1010, and SURFYNOL 104, 400, and 440 (manufactured by Nissin Chemical Industry Co., Ltd.).

Specific examples of the cationic surfactant include an organosiloxane polymer KP341 (manufactured by Shin-Etsu Chemical Co., Ltd.), a (meth)acrylic acid-based (co)polymer POLYFLOW No. 75, No. 90, and No. 95 (manufactured by KYOEISHA CHEMICAL CO., LTD.), and W001 (manufactured by Yusho Co., Ltd.).

Examples of the anionic surfactant include W004, W005, and W017 (manufactured by Yusho Co., Ltd.), and SAN-DET BL (manufactured by Sanyo Chemical Industries, Ltd.).

Examples of the silicone-based surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all manufactured by Dow Corning Toray Co., Ltd.), TSF-4440, TSF-4300, TSF-4445, TSF-4460, and TSF-4452 (all manufactured by Momentive Performance Materials Co., Ltd.), KP341, KF6001, and KF6002 (all manufactured by Shin-Etsu Chemical Co., Ltd.), and BYK307, BYK323, and BYK330 (all manufactured by BYK Chemie).

The content of the surfactant is preferably 0.001% to 2.0% by mass, and more preferably 0.005% to 1.0% by mass, with respect to the total solid content of the coloring composition. The surfactant may be used singly or in combination of two or more kinds thereof. In a case where two or more kinds of surfactants are included, the total amount thereof is preferably within the range.

«Ultraviolet Absorber»

The coloring composition of the embodiment of the present invention can contain an ultraviolet absorber. As the ultraviolet absorber, a conjugated diene compound, an aminobutadiene compound, a methyldiebenzoyl compound, a coumarin compound, a salicylate compound, a benzophenone compound, a benzotriazole compound, an acrylonitrile compound, a hydroxyphenyltriazine compound, or the like can be used. With regard to details thereof, reference can be made to the description in paragraph Nos. 0052 to 0072 of JP2012-208374A and paragraph Nos. 0317 to 0334 of JP2013-068814A, and the contents of which are incorporated herein by reference. Specific examples of the ultraviolet absorber include a compound having the following structure. Examples of commercially available products of the ultraviolet absorber include UV-503 (manufactured by Daito Chemical Co., Ltd). In addition, as the benzotriazole compound, MYUA series manufactured by Miyoshi Oil & Fat Co., Ltd. (The Chemical Daily, Feb. 1, 2016) may be used.

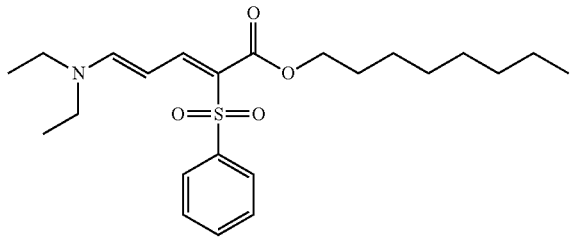 [SMILES: CCCCCCCCOC(=O)/C(=C/C=C/N(CC)CC)S(=O)(=O)c1ccccc1]

In a case where the coloring composition of the embodiment of the present invention contains an ultraviolet absorber, the content of the ultraviolet absorber is preferably 0.1% to 10% by mass, more preferably 0.1% to 5% by mass, and particularly preferably 0.1% to 3% by mass, with respect to the total solid content of the coloring composition. Further, only one kind or two or more kinds of the ultraviolet absorbers may be used. In a case where two or more kinds of the ultraviolet absorbers are included, the total amount thereof is preferably within the range.

«Silane Coupling Agent»

The coloring composition of the embodiment of the present invention can contain a silane coupling agent. In the present invention, the silane coupling agent means a silane compound having a hydrolyzable group and another functional group. Further, the hydrolyzable group refers to a substituent that can be directly linked to a silicon atom to generate a siloxane bond by a hydrolysis reaction and/or a condensation reaction. Examples of the hydrolyzable group include a halogen atom, an alkoxy group, and an acyloxy group.

The silane coupling agent is preferably a silane compound having at least one selected from a vinyl group, an epoxy group, a styrene group, a methacryl group, an amino group, an isocyanurate group, a ureido group, a mercapto group, a sulfide group, or an isocyanate group, or an alkoxy group. Specific examples of the silane coupling agent include N-β-aminoethyl-γ-aminopropyl methyldimethoxysilane (KBM-602, manufactured by Shin-Etsu Chemical Co., Ltd.), N-β-aminoethyl-γ-aminopropyl trimethoxysilane (KBM-603, manufactured by Shin-Etsu Chemical Co., Ltd.), N-β-aminoethyl-γ-aminopropyl triethoxysilane (KBE-602, manufactured by Shin-Etsu Chemical Co., Ltd.), γ-aminopropyl trimethoxysilane (KBM-903, manufactured by Shin-Etsu Chemical Co., Ltd.), γ-aminopropyl triethoxysilane (KBE-903, manufactured by Shin-Etsu Chemical Co., Ltd.), 3-methacryloxypropyl trimethoxysilane (KBM-503, manufactured by Shin-Etsu Chemical Co., Ltd.), and 3-glycidoxypropyl trimethoxysilane (KBM-403, manufactured by Shin-Etsu Chemical Co., Ltd.). With regard to details of the silane coupling agent, reference can be made to the description in paragraph Nos. 0155 to 0158 of JP2013-254047A, and the contents thereof are incorporated herein by reference.

In a case where the coloring composition of the embodiment of the present invention contains a silane coupling agent, the content of the silane coupling agent is preferably 0.001% to 20% by mass, more preferably 0.01% to 10% by mass, and particularly preferably 0.1% to 5% by mass, with respect to the total solid content of the coloring composition. The coloring composition of the embodiment of the present invention may include one kind or two or more kinds of the silane coupling agents. In a case where the coloring composition includes two or more kinds of the silane coupling agents, the total amount thereof is preferably within the range.

«Polymerization Inhibitor»

The coloring composition of the embodiment of the present invention can contain a polymerization inhibitor. Examples of the polymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), and an N-nitrosophenylhydroxylamine salt (an ammonium salt, a cerous salt, or the like).

In a case where the coloring composition of the embodiment of the present invention contains a polymerization inhibitor, the content of the polymerization inhibitor is preferably 0.01% to 5% by mass with respect to the total solid content of the coloring composition. The coloring composition of the embodiment of the present invention may include one kind or two or more kinds of the polymerization inhibitors. In a case where two or more kinds of polymerization inhibitors are included, the total amount thereof is preferably within the range.

«Other Additives»

Various additives such as a filler, an adhesion promoter, an antioxidant, and an aggregation inhibitor can be blended into the coloring composition of the embodiment of the present invention, as desired. Examples of these additives include the additives described in paragraph Nos. 0155 and 0156 of JP2004-295116A, and the contents thereof are incorporated herein by reference. Further, as the antioxidant, for example, a phenol compound, a phosphorus-based compound (for example, the compounds described in paragraph No. 0042 of JP2011-090147A), a thioether compound, or the like can be used. Examples of a commercially available product thereof include ADEKA STAB series (AO-20, AO-30, AO-40, AO-50, AO-50F, AO-60, AO-60G, AO-80, AO-330, and the like), all manufactured by ADEKA. The antioxidant may be used singly or in combination of two or more kinds thereof. The coloring composition of the embodiment of the present invention can contain the sensitizers or the light stabilizers described in paragraph No. 0078 of JP2004-295116A, or the thermal polymerization inhibitors described in paragraph No. 0081 of the same publication.

There are some cases where a metal element is included in the coloring composition according to raw materials and the like, but from the viewpoint of suppression of generation of defects, or the like, the content of Group 2 elements (calcium, magnesium, and the like) in the coloring composition is preferably 50 ppm by mass or less, and more preferably 0.01 to 10 ppm by mass. Further, the total amount of the inorganic metal salts in the coloring composition is preferably 100 ppm by mass or less and more preferably 0.5 to 50 ppm by mass.

The moisture content in the coloring composition of the embodiment of the present invention is usually 3% by mass or less, preferably 0.01% to 1.5% by mass, and more preferably in the range of 0.1% to 1.0% by mass. The moisture content can be measured by a Karl Fischer method.

The coloring composition of the embodiment of the present invention can be used after its viscosity is adjusted for the purposes of adjusting the state of a film surface (flatness or the like), adjusting a film thickness, or the like. The value of the viscosity can be appropriately selected as desired, and is, for example, preferably 0.3 mPa×s to 50 mPa×s, and more preferably 0.5 mPa×s to 20 mPa×s at 25°

C. As for a method for measuring the viscosity, the viscosity can be measured, for example, with a temperature being adjusted to 25° C., using a viscometer RE85L (rotor: 1°34'× R24, measurement range of 0.6 to 1,200 mPa·s) manufactured by Toki Sangyo Co., Ltd.

A storage container for the coloring composition of the embodiment of the present invention is not particularly limited, and a known storage container can be used. Further, as the storage container, it is also preferable to use a multilayer bottle having an inner wall constituted with six layers from six kinds of resins or a bottle having a 7-layer structure from 6 kinds of resins for the purpose of suppressing incorporation of impurities into raw materials or compositions. Examples of such a container include the containers described in JP2015-123351A.

The coloring composition of the embodiment of the present invention can be preferably used as a coloring composition for forming a colored layer in a color filter. Examples of the colored layer include a red colored layer, a green colored layer, a blue colored layer, a magenta colored layer, a cyan colored layer, and a yellow colored layer.

In a case where the coloring composition of the embodiment of the present invention is used as a color filter in applications for a liquid crystal display device, the voltage holding ratio of a liquid crystal display element comprising a color filter is preferably 70% or more, and more preferably 90% or more. Known means for obtaining a high voltage holding ratio can be incorporated as appropriate, and examples of typical means include use of high-purity materials (for example, reduction in ionic impurities) and control of the amount of acidic functional groups in a composition. The voltage holding ratio can be measured by, for example, the methods described in paragraph 0243 of JP2011-008004A and paragraphs 0123 to 0129 of JP2012-224847A.

<Method for Preparing Coloring Composition>

The coloring composition of the embodiment of the present invention can be prepared by mixing the above-mentioned components. In the preparation of the coloring composition, all the components may be dissolved and/or dispersed at the same time in a solvent to prepare the coloring composition, or the respective components may be appropriately left in two or more solutions or dispersion liquids and mixed to prepare the coloring composition upon use (during coating), as desired.

Furthermore, in the preparation of the coloring composition, a process for dispersing the pigment is preferably included. In the process for dispersing the pigment, examples of a mechanical force that is used for dispersion of the pigment include compression, pressing, impact, shear, and cavitation. Specific examples of these processes include a beads mill, a sand mill, a roll mill, a ball mill, a paint shaker, a microfluidizer, a high-speed impeller, a sand grinder, a flow jet mixer, high-pressure wet atomization, and ultrasonic dispersion. Further, in the pulverization of the pigment in a sand mill (beads mill), it is preferable to perform a treatment under the condition for increasing a pulverization efficiency by using beads having small diameters; increasing the filling rate of the beads; or the like. Incidentally, it is preferable to remove coarse particles by filtration, centrifugation, or the like after the pulverization treatment. In addition, as the process and the dispersing machine for dispersing the pigment, the process and the dispersing machine described in "Dispersion Technology Comprehension, published by Johokiko Co., Ltd., Jul. 15, 2005", "Actual comprehensive data collection on dispersion technology and industrial application centered on suspension (solid/liquid dispersion system), published by Publication Department, Management Development Center, Oct. 10, 1978", and paragraph No. 0022 of JP2015-157893A can be suitably used. In addition, in the process for dispersing the pigment, a refining treatment of particles in a salt milling process may be performed. With regard to the materials, the equipment, the process conditions, and the like used in the salt milling process, reference can be made to, for example, the description in JP2015-194521A and JP2012-046629A.

It is preferable that in the preparation of the coloring composition, a composition formed by mixing the respective components is filtered through a filter for the purpose of removing foreign matters, reducing defects, or the like. As the filter, any filters that have been used in the related art for filtration use and the like may be used without particular limitation. Examples of the filter include filters formed of materials including, for example, a fluorine resin such as polytetrafluoroethylene (PTFE), a polyamide-based resin such as nylon (for example, nylon-6 and nylon-6,6), and a polyolefin resin (including a polyolefin resin having a high density and/or an ultrahigh molecular weight) such as polyethylene and polypropylene (PP). Among these materials, polypropylene (including a high-density polypropylene) and nylon are preferable.

The pore diameter of the filter is suitably approximately 0.01 to 7.0 μm, preferably approximately 0.01 to 3.0 μm, and more preferably approximately 0.05 to 0.5 μm.

In addition, a fibrous filter material is also preferably used as the filter. Examples of the fibrous filter material include a polypropylene fiber, a nylon fiber, and a glass fiber. Examples of a filter using the fibrous filter material include filter cartridges of SBP type series (SBP008 and the like), TPR type series (TPR002, TPR005, and the like), or SHPX type series (SHPX003 and the like), all manufactured by Roki Techno Co., Ltd.

In a case of using a filter, different filters may be combined. Here, the filtration with each of the filters may be performed once or may be performed twice or more times.

For example, filters having different pore diameters within the above-mentioned range may be combined. With regard to the pore diameter of the filter herein, reference can be made to nominal values of filter manufacturers. A commercially available filter can be selected from, for example, various filters provided by Nihon Pall Corporation (DFA4201NXEY and the like), Toyo Roshi Kaisha., Ltd., Nihon Entegris K.K. (formerly Nippon Microlith Co., Ltd.), Kitz Micro Filter Corporation, and the like.

In addition, the filtration through the first filter may be performed with only a dispersion liquid, the other components may be mixed therewith, and then the filtration through the second filter may be performed. As the second filter, a filter formed of the same material as that of the first filter, or the like can be used.

<Cured Film>

The cured film of an embodiment of the present invention is a cured film obtained from the above-mentioned coloring composition of the embodiment of the present invention. The cured film of the embodiment of the present invention can be preferably used as a colored layer of a color filter. Examples of the colored layer include a red colored layer, a green colored layer, a blue colored layer, a magenta colored layer, a cyan colored layer, and a yellow colored layer.

The film thickness of the cured film can be appropriately adjusted depending on purposes. For example, the film thickness is preferably 20 μm or less, more preferably 10 μm or less, and still more preferably 5 μm or less. The lower limit of the film thickness is preferably 0.1 µm or more, more preferably 0.2 µm or more, and still more preferably 0.3 µm or more.

<Color Filter>

Next, the color filter of an embodiment of the present invention will be described. The color filter of the embodiment of the present invention has the above-mentioned cured film of the embodiment of the present invention. In the color filter of the embodiment of the present invention, the film thickness of the cured film can be appropriately adjusted depending on the purposes. For example, the film thickness is preferably 20 µm or less, more preferably 10 µm or less, and still more preferably 5 µm or less. The lower limit of the film thickness is preferably 0.1 µm or more, more preferably 0.2 µm or more, and still more preferably 0.3 µm or more. The color filter of the embodiment of the present invention can be used for a solid-state imaging element such as a charge coupled device (CCD) and a complementary metal-oxide semiconductor (CMOS), an image display device, or the like.

<Pattern Forming Method>

Next, the pattern forming method of an embodiment of the present invention will be described. The pattern forming method of the embodiment of the present invention includes a step of forming a coloring composition layer on a support with the coloring composition of the embodiment of the present invention, a step of patternwise exposing the coloring composition layer (exposing step), a step of removing the unexposed area of the coloring composition by development to form a pattern (developing step), and a step of heating the developed pattern (heating step). Hereinafter, the respective steps will be described.

«Step of Forming Coloring Composition Layer»

In the step of forming a coloring composition layer, the coloring composition layer is formed on a support, using the coloring composition.

The support is not particularly limited, and can be appropriately selected depending on applications. Examples of the support include a glass substrate, a substrate for a solid-state imaging element, on which a solid-state imaging element (light-receiving element) such as a CCD and a CMOS is provided, and a silicon substrate. Further, an undercoat layer may be provided on the substrate, as desired, so as to improve adhesion to a layer above the support, to prevent diffusion of materials, or to flatten a surface of the substrate.

As a method for applying the coloring composition onto the support, various coating methods such as slit coating, an ink jet method, spin coating, cast coating, roll coating, and a screen printing method can be used.

The coloring composition layer formed on the support may be dried (pre-baked). In a case of forming a pattern by a low-temperature process, pre-baking may not be performed. In a case of performing the pre-baking, the pre-baking temperature is preferably 150° C. or lower, more preferably 120° C. or lower, and still more preferably 110° C. or lower. The lower limit may be set to, for example, 50° C. or higher, or to 80° C. or higher. By setting the pre-baking temperature to 150° C. or lower, these characteristics can be more effectively maintained in a case of a configuration in which a photo-electric conversion film of an image sensor is formed of organic materials. The pre-baking time is preferably 10 seconds to 300 seconds, more preferably 40 to 250 seconds, and still more preferably 80 to 220 seconds. Drying can be performed using a hot plate, an oven, or the like.

«Exposing Step»

Next, the coloring composition layer formed on the support is patternwise exposed (exposing step). For example, the coloring composition layer can be subjected to patternwise exposure by performing exposure using an exposure device such as a stepper through a mask having a predetermined mask pattern. Thus, the exposed portion can be cured. As the radiation (light) which can be used during the exposure, ultraviolet rays such as g-rays and i-rays (particularly preferably i-rays) are preferably used. The irradiation dose (exposure dose) is, for example, preferably 0.03 to 2.5 J/cm$^2$ and more preferably 0.05 to 1.0 J/cm$^2$. The oxygen concentration during the exposure can be appropriately selected, and the exposure may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume), in addition to an atmospheric air. Further, the exposure illuminance can be appropriately set, and can be usually selected from a range of 1,000 W/m$^2$ to 100,000 W/m$^2$ (for example, 5,000 W/m$^2$, 15,000 W/m$^2$, or 35,000 W/m$^2$). Appropriate conditions of each of the oxygen concentration and the exposure illuminance may be combined, and for example, a combination of the oxygen concentration of 10% by volume and the illuminance of 10,000 W/m$^2$, a combination of the oxygen concentration of 35% by volume and the illuminance of 20,000 W/m$^2$, or the like is available.

«Developing Step»

Next, the unexposed areas of the coloring composition layer are removed by development to form a pattern. The removal of the unexposed areas of the coloring composition layer by development can be carried out using a developer. Thus, the coloring composition layer of the unexposed areas in the exposing step is eluted into the developer, and as a result, only a photocured portion remains.

As the developer, an organic alkali developer causing no damage on the underlying solid-state imaging element, circuit, or the like is preferable.

The temperature of the developer is preferably, for example, 20° C. to 30° C., and the development time is preferably 20 to 180 seconds. Further, in order to improve residue removing properties, a step of removing the developer by shaking per 60 seconds and supplying a fresh developer may be repeated multiple times.

As the developer, an aqueous alkaline solution obtained by diluting an alkali agent with pure water is preferably used. Examples of the alkali agent include organic alkaline compounds such as aqueous ammonia, ethylamine, diethylamine, dimethylethanolamine, diglycol amine, diethanolamine, hydroxyamine, ethylenediamine, tetramethylammonium hydroxide, tetraethylammonium hydroxide, tetrapropylammonium hydroxide, tetrabutylammonium hydroxide, benzyltrimethylammonium hydroxide, dimethylbis(2-hydroxyethyl)ammonium hydroxide, choline, pyrrole, piperidine, and 1,8-diazabicyclo[5.4.0]-7-undecene, and inorganic alkaline compounds such as sodium hydroxide, potassium hydroxide, sodium carbonate, sodium hydrogen carbonate, sodium silicate, and sodium metasilicate. The concentration of the alkali agent in the aqueous alkaline solution is preferably 0.001% to 10% by mass and more preferably 0.01% to 1% by mass. Moreover, the developer may further include a surfactant. Examples of the surfactant include the surfactants described above, and the surfactant is preferably a nonionic surfactant. From the viewpoints of transportation, storage, and the like, the developer may be first produced as a concentrated liquid and then diluted to a concentration required upon the use. The dilution ratio is not particularly limited, and can be set to, for example, a range of 1.5 to 100 times. In addition, in a case where a developer including such an aqueous alkaline solution is used, it is preferable to perform washing (rinsing) with pure water after development.

«Heating Step»

Next, the developed pattern is heated (post-baked). By performing the post-baking, it is possible to generate radicals from the thermal-radical polymerization initiator, which makes a reaction of the radically polymerizable compound proceed, and thus, the unreacted radically polymerizable compound can be suppressed from remaining in the cured film. By making it possible to suppress the unreacted radically polymerizable compound from remaining in the cured film, it is possible to form a cured film having excellent moisture resistance. The post-baking temperature is preferably, for example, 100° C. to 240° C. From the viewpoint of curing of the film, the post-baking temperature is more preferably 200° C. to 230° C. The Young's modulus of the film after post-baking is preferably 0.5 to 20 GPa and more preferably 2.5 to 15 GPa. In addition, in a case where a support on which the cured film is formed includes an organic electroluminescence (organic EL) element, an image sensor having a photo-electric conversion film constituted with organic materials, or the like, the post-baking temperature is preferably 150° C. or lower. The lower limit can be set to, for example, 50° C. or higher. The post-baking can be performed continuously or batchwise by using a heating means such as a hot plate, a convection oven (hot-air circulating dryer), and a high-frequency heater so that the film after development (cured film) satisfies the conditions.

The cured film preferably has high flatness. Specifically, the surface roughness Ra is preferably 100 nm or less, more preferably 40 nm or less, and still more preferably 15 nm or less. The lower limit is not specified, but is preferably, for example, 0.1 nm or more. The surface roughness can be measured, for example, using an atomic force microscope (AFM) Dimension 3100 manufactured by Veeco Instruments, Inc.

In addition, the contact angle of water on the cured film can be appropriately set to a preferred value and is typically in the range of 50 to 1100. The contact angle can be measured, for example, using a contact angle meter CV-DT-A Model (manufactured by Kyowa Interface Science Co., Ltd.).

A higher volume resistivity value of each pattern (pixel) is desired. Specifically, the volume resistivity value of the pixel is preferably $10^9 \Omega \times cm$ or more and more preferably $10^{11} \Omega \times cm$ or more. The upper limit is not defined, but is, for example, preferably $10^{14} \Omega \times cm$ or less. The volume resistivity value of the pixel can be measured, for example, using an ultra high resistance meter 5410 (manufactured by Advantest Corporation).

<Solid-State Imaging Element>

The solid-state imaging element of an embodiment of the present invention has the above-mentioned color filter of the embodiment of the present invention. The configuration of the solid-state imaging element of the embodiment of the present invention is not particularly limited as long as the solid-state imaging element is configured to include the color filter of the embodiment of the present invention and function as a solid-state imaging element. Examples of the configuration include the following configurations.

The solid-state imaging element is configured to have a plurality of photodiodes constituting a light receiving area of the solid-state imaging element (a charge coupled device (CCD) image sensor, a complementary metal-oxide semiconductor (CMOS) image sensor, or the like), and a transfer electrode formed of polysilicon or the like on a substrate; have a light-shielding film having openings only over the light receiving portion of the photodiodes on the photodiodes and the transfer electrodes; have a device-protective film formed of silicon nitride or the like, which is formed to coat the entire surface of the light-shielding film and the light receiving portion of the photodiodes, on the light-shielding film; and have a color filter on the device-protective film. In addition, the solid-state imaging element may also be configured, for example, such that it has a light collecting means (for example, a microlens, which is the same hereinafter) on a device-protective film under a color filter (a side closer to the substrate), or has a light collecting means on a color filter. Further, the color filter may have a structure in which a cured film forming each coloring pixel is embedded in a space partitioned in a lattice shape by a partition wall. The partition wall in this case preferably has a low refractive index for each coloring pixel. Examples of an imaging device having such a structure include the devices described in JP2012-227478A and JP2014-179577A. An imaging device comprising the solid-state imaging element of the embodiment of the present invention can also be used as a vehicle camera or a monitoring camera, in addition to a digital camera or electronic equipment (mobile phones or the like) having an imaging function.

<Image Display Device>

The color filter of the embodiment of the present invention can be used for an image display device such as a liquid crystal display device and an organic electroluminescence display device. The definitions of image display devices or the details of the respective image display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd.)", and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and can be applied to, for example, liquid crystal display devices employing various systems described in the "Liquid Crystal Display Technology for Next Generation".

EXAMPLES

Hereinbelow, the present invention will be described in more detail with reference to Examples. The materials, the amounts of materials to be used, the proportions, the treatment details, the treatment procedure, or the like shown in the Examples below may be modified appropriately as long as the modifications do not depart from the spirit of the present invention. Therefore, the scope of the present invention is not limited to the specific Examples shown below. In addition, "parts" and "%" are on a mass basis unless otherwise specified.

<Production of Pigment Dispersion Liquid>

The following raw materials were mixed and the obtained mixed solution was subjected to a dispersion treatment by using Ultra apex mill (trade name) manufactured by Kotobuki Industries Co., Ltd. as a circulation type dispersion apparatus (beads mill) to obtain a dispersion liquid. (Solid content after preparation: 18.55% by mass)

C. I. Pigment Green 36 . . . 7.91 parts by mass
C. I. Pigment Yellow 150 . . . 4.68 parts by mass
Dispersant D-1 . . . 2.92 parts by mass Dispersant D-2 . . . 1.54 parts by mass Alkali-Soluble Resin C-1 . . . 1.50 parts by mass Propylene Glycol Monomethyl Ether Acetate (PGMEA) . . . 72.64 parts by mass Propylene Glycol Monomethyl Ether (PGME) . . . 1.27 parts by mass Cyclohexanone . . . 7.54 parts by mass Dispersant D-1: Resin (D-1) of the following structure (Mw=20,000, acid value=35 mgKOH/g, the numerical value described together with the main chain is a molar ratio and the numerical value together with the side chain is the number of the repeating unit)

Dispersant D-2: Resin (D-2) of the following structure (Mw=25,000, acid value=50 mgKOH/g, the numerical value described together with the main chain is a molar ratio and the numerical value together with the side chain is the number of the repeating unit)

Alkali-Soluble Resin C-1: Resin (C-1) of the following structure (Mw=10,000, acid value=70 mgKOH/g, the numerical value described together with the main chain is a molar ratio and Me is a methyl group)

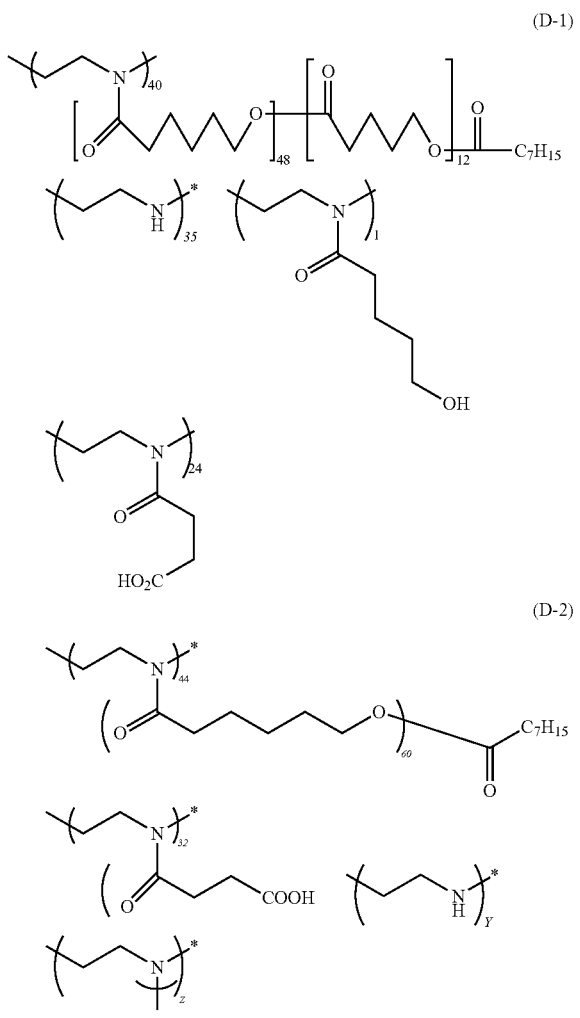

(D-1)

(D-2)

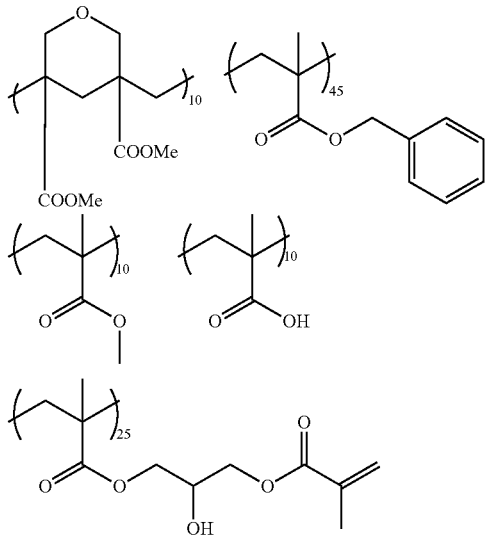

(C-1)

<Preparation of Coloring Composition>

The following raw materials were mixed to prepare green coloring compositions of Examples 1 to 9 and Comparative Examples 1 to 4. Moreover, in Example 4 and Comparative Example 2, 0.4 parts by mass of EHPE 3150 (manufactured by Daicel) was further added as an epoxy compound. Furthermore, in Examples 5 to 8, the ratios of the thermal-radical initiator and the photo-radical initiator were changed as shown in the table. In Example 9, the coloring composition was prepared using two kinds of thermal-radical initiators at a mass ratio of 50:50 in a total addition amount which was the same as in Example 1. In addition, in Comparative Examples 1 and 2, a thermal-radical polymerization initiator was not added.

PGMEA . . . 19.35 parts by mass

Alkali-Soluble Resin C-1 . . . 0.15 parts by mass

Polymerizable Compound (KAYARAD DPHA, manufactured by Nippon Kayaku Co., Ltd.) . . . 2.76 parts by mass Surfactant (following compound, Mw=14,000, in the following formula, % representing the ratio of the repeating unit is % by mole) . . . 0.04 parts by mass

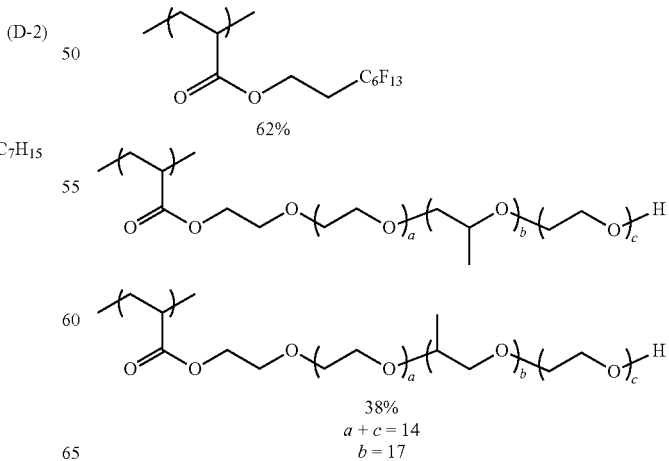

Photo-radical Polymerization Initiator (IRGACURE-OXE01, manufactured by BASF) . . . 1.00 part by mass Ultraviolet absorber (compound having the following structure) . . . 0.60 parts by mass

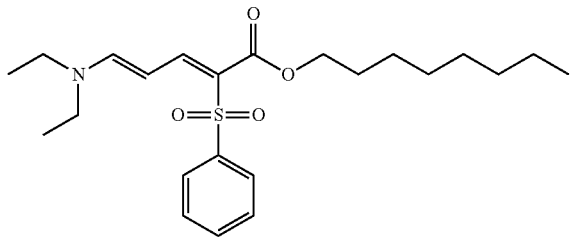 [SMILES: CCCCCCCCOC(=O)/C(=C/C=C/N(CC)CC)S(=O)(=O)c1ccccc1]

Thermal-radical Polymerization Initiator described in Table 1 . . . 1.00 part by mass Polymerization inhibitor (p-methoxyphenol) . . . 0.01 parts by mass Pigment Dispersion Liquid . . . 64.17 parts by mass (solid content: 12.80 parts by mass)

TABLE 1

|  | Thermal-radical polymerization | | Blended amount of photo-radical polymerization initiator | Epoxy compound |
|---|---|---|---|---|
|  | Type | Blended amount |  |  |
| Example 1 | TI-1 | 1.00 part by mass | 1.00 part by mass | None |
| Example 2 | TI-2 | 1.00 part by mass | 1.00 part by mass | None |
| Example 3 | TI-3 | 1.00 part by mass | 1.00 part by mass | None |
| Example 4 | TI-1 | 1.00 part by mass | 1.00 part by mass | EHPE3150 |
| Example 5 | TI-1 | 0.62 parts by mass | 1.38 parts by mass | None |
| Example 6 | TI-1 | 0.52 parts by mass | 1.48 parts by mass | None |
| Example 7 | TI-1 | 1.38 parts by mass | 0.62 parts by mass | None |
| Example 8 | TI-1 | 1.52 parts by mass | 0.48 parts by mass | None |
| Example 9 | TI-1,TI-2 | 1.00 part by mass | 1.00 part by mass | None |
| Comparative Example 1 | None | — | 1.00 part by mass | None |
| Comparative Example 2 | None | — | 1.00 part by mass | EHPE3150 |
| Comparative Example 3 | TI-4 | 1.00 part by mass | 1.00 part by mass | None |
| Comparative Example 4 | TI-5 | 1.00 part by mass | 1.00 part by mass | None |

(Thermal-Radical Polymerization Initiator)

TI-1: A compound having the following structure (a pinacol compound, a molar absorption coefficient at a wavelength of 365 nm=10 L×mol$^{-1}$×cm$^{-1}$, and a thermal decomposition temperature=182° C.)

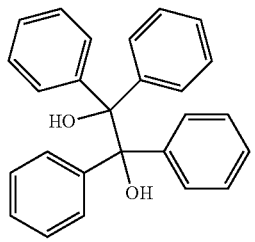 [SMILES: OC(c1ccccc1)(c1ccccc1)C(O)(c1ccccc1)c1ccccc1]

TI-2: An α-hydroxyacetophenone compound (IRGACURE-184, manufactured by BASF, a molar absorption coefficient at a wavelength of 365 nm=19.5 L×mol$^{-1}$×cm$^{-1}$, and a thermal decomposition temperature=151° C.)

TI-3: An α-hydroxyacetophenone compound (IRGACURE-2959, manufactured by BASF, a molar absorption coefficient at a wavelength of 365 nm=60 L×mol$^{-1}$×cm$^{-1}$, and a thermal decomposition temperature of 174° C.)

TI-4: 2,2'-Azobis(2,4-dimethylvaleronitrile) (an azo compound, a molar absorption coefficient at a wavelength of 365 nm=10 L×mol$^{-1}$×cm$^{-1}$, and a thermal decomposition temperature of 85° C.)

TI-5: Benzoyl peroxide (a peroxide, a molar absorption coefficient at a wavelength of 365 nm=10 L×mol$^{-1}$×cm$^{-1}$, and a thermal decomposition temperature of 103° C.)

Evaluation

Manufacture of Cured Film for Measurement of Shrinkage

Production Example 1

Each coloring composition was applied onto a soda glass (75 mm×75 mm square, 1.1 mm thickness) using a spin coater (H-360S, manufactured by MIKASA CO., LTD.). Next, the coloring composition was prebaked at 100° C. for 2 minutes by using a hot plate to obtain a coating film. The obtained coating film was exposed at 1,000 mJ/cm$^2$ by an ultra-high pressure mercury lamp (USH-500BY, manufactured by USHIO INC.). The coating film after exposure was heated at 200° C. for 5 minutes on a hot plate in an air atmosphere to obtain a cured film having a film thickness of 0.5 μm. With regard to the obtained cured film, a film thickness was measured using a film thickness measuring machine (DektakXT manufactured by ULVAC Inc. [trade name]).

Production Example 2

Each coloring composition was applied onto a soda glass (75 mm×75 mm square, 1.1 mm thickness) using a spin coater (H-360S, manufactured by MIKASA CO., LTD.). Next, the coloring composition was prebaked at 100° C. for 2 minutes by using a hot plate to obtain a coating film. The coating film after exposure was heated at 200° C. for 5 minutes on a hot plate in an air atmosphere to obtain a cured film having a film thickness of 0.5 μm. With regard to the obtained cured film, a film thickness was measured using a film thickness measuring machine (DektakXT manufactured by ULVAC Inc. [trade name]).

《Evaluation of Moisture Resistance》

Each of the cured films prepared in Production Example 1 and Production Example 2 was held under the conditions of a temperature of 110° C. and a humidity of 85% for 168 hours, using highly accelerated stress test (HAST) equipment (manufactured by Espec Corporation, HAST CHAMBER EHS 221). The film thickness was measured using a film thickness testing machine after the highly accelerated stress test (HAST), and a shrinkage was calculated from the film thickness before the HAST test and the film thickness after the HAST test by the following equation.

Shrinkage (%)={(Film thickness after HAST test−Film thickness before HAST test)/(Film thickness before HAST test)}×100

Based on the calculated shrinkage, the moisture resistance was evaluated in accordance with the following standard.

(Evaluation Standard for Evaluation of Moisture Resistance on Cured Film of Production Example 1)
5: The shrinkage is 0% or more and less than 8%
4: The shrinkage is 8% or more and less than 10%
3: The shrinkage is 10% or more and less than 12%
2: The shrinkage is 12% or more and less than 15%
1: The shrinkage is 15% or more (Evaluation Standard for Evaluation of Moisture Resistance on Cured Film of Production Example 2)
5: The shrinkage is 0% or more and less than 10%
4: The shrinkage is 10% or more and less than 15%
3: The shrinkage is 15% or more and less than 20%
2: The shrinkage is 20% or more and less than 25%
1: The shrinkage is 25% or more 《Evaluation of Temporal Stability》

A viscosity of each of the coloring compositions immediately after preparation was measured using a viscometer (manufactured by Toki Sangyo Co., Ltd., RE85L, a rotor: 1°34'×R24, and a measurement range of 0.6 to 1,200 mPa×s). Next, after the coloring composition was held at 45° C. for 72 hours, the viscosity was measured again, and the temporal stability was evaluated in accordance with the following standard from a rate of change in the viscosity of the coloring composition between before and after the holding, based on the following equation. In addition, in the measurement of the viscosity, the measurement was performed at a temperature of the coloring composition adjusted to 25.

Rate (%) of change in viscosity={|Viscosity of coloring composition immediately after production−Viscosity of coloring composition after holding|/(Viscosity of coloring composition immediately after production)}×100

5: The rate of change in the viscosity is less than 5%.
4: The rate of change in the viscosity is 5% or more and less than 7%.
3: The rate of change in the viscosity is 7% or more and less than 10%.
2: The rate of change in the viscosity is 10% or more and less than 20%.
1: The rate of change in the viscosity is 20% or more.

《Evaluation of Lithographic Properties》

Each coloring composition obtained by the above-mentioned method was applied onto an 8 inches (20.32 cm) silicon wafer with an undercoat layer using a spin coater (Act8, manufactured by Tokyo Electron Limited.) so that the film thickness after the coating was 0.7 μm, and then heated at 100° C. for 2 minutes using a hot plate to obtain a cured film.

Next, the obtained cured film was exposed to light in an exposure dose 50 to 1,700 mJ/cm$^2$ through a mask having a pattern of 2.0 μm square by using an i-rays stepper exposure device (FPA-3000 i5+, manufactured by Canon Inc.).

Next, the exposed cured film was shower-developed at 23° C. for 60 seconds using a 0.3% by mass of an aqueous solution of tetramethylammonium hydroxide (TMAH) as a developer and using a developing device (Act8, manufactured by Tokyo Electron Limited.). Thereafter, rinsing was performed with pure water by spin shower, and then spin drying was performed to obtain a pattern.

The obtained pattern was observed at 20,000 times magnification by using a scanning electron microscope (SEM) (S-4800H, manufactured by Hitachi High-Technologies Corporation.). Based on the observed image, lithographic properties were evaluated by the following standard. The evaluation test of lithographic properties was performed 3 times for each coloring composition and the result was collected and determined.

5: The pattern is clear and there is no residue.
4: The pattern is clear and there is a small residue.
3: The pattern is slightly taper shaped, but there is a small residue.
2: The pattern is taper shaped, and there is a lot of residues.
1: The pattern is not formed.

TABLE 2

| | Moisture resistance (Production Example 1) | Moisture resistance (Production Example 2) | Temporal stability | Lithographic properties | Thermal-radical polymerization initiator/ Photo-radical polymerization initiator*100 (mass ratio) | Thermal-radical polymerization initiator/ Polymerizable compound*100 (mass ratio) |
|---|---|---|---|---|---|---|
| Example 1 | 5 | 4 | 5 | 5 | 100 | 25 |
| Example 2 | 5 | 4 | 5 | 4 | 100 | 25 |
| Example 3 | 4 | 4 | 5 | 5 | 100 | 25 |
| Example 4 | 5 | 5 | 5 | 5 | 100 | 25 |
| Example 5 | 4 | 4 | 5 | 5 | 45 | 15 |
| Example 6 | 4 | 3 | 5 | 4 | 35 | 13 |

TABLE 2-continued

|  | Moisture resistance (Production Example 1) | Moisture resistance (Production Example 2) | Temporal stability | Litho-graphic properties | Thermal-radical polymerization initiator/ Photo-radical polymerization initiator*100 (mass ratio) | Thermal-radical polymerization initiator/ Polymerizable compound*100 (mass ratio) |
|---|---|---|---|---|---|---|
| Example 7 | 5 | 4 | 5 | 4 | 223 | 34 |
| Example 8 | 5 | 4 | 5 | 3 | 320 | 37 |
| Example 9 | 5 | 5 | 5 | 5 | 100 | 25 |
| Comparative Example 1 | 1 | 1 | 5 | 5 | 0 | 0 |
| Comparative Example 2 | 2 | 2 | 5 | 5 | 0 | 0 |
| Comparative Example 3 | 2 | 4 | 2 | 1 | 100 | 25 |
| Comparative Example 4 | 2 | 4 | 2 | 4 | 100 | 25 |

As shown in the table, the coloring compositions of Examples were capable of forming a cured film having good storage stability and excellent moisture resistance.

Red and blue coloring compositions were manufactured by the same method as in Example 1, except that the pigment species used were changed as follows, and similarly good results were obtained.

<Red Coloring Composition>
C. I. Pigment Red 254 . . . 8.70 parts by mass
C. I. Pigment Yellow 139 . . . 3.89 parts by mass
<Blue Coloring Composition>
C. I. Pigment Blue 15:6 . . . 9.98 parts by mass
C. I. Pigment Violet 23 . . . 2.61 parts by mass

What is claimed is:

1. A coloring composition comprising:
   a colorant;
   a radically polymerizable compound;
   a photo-radical polymerization initiator; and
   a thermal-radical polymerization initiator,
   wherein the thermal-radical polymerization initiator includes pinacol compound,
   the colorant includes at least one selected from the group consisting of C. I. Pigment Green 7, C. I. Pigment Green 10, C. I. Pigment Green 36, C. I. Pigment Green 37, C. I. Pigment Green 58, and C. I. Pigment Green 59, and
   the content of the colorant is 30% to 80% by mass with respect to the total solids content of the coloring composition.

2. The coloring composition according to claim 1, wherein the coloring composition includes 10 to 1,000 parts by mass of the thermal-radical polymerization initiator with respect to 100 parts by mass of the photo-radical polymerization initiator.

3. The coloring composition according to claim 1, wherein the coloring composition includes 1 to 200 parts by mass of the photo-radical polymerization initiator and 1 to 200 parts by mass of the thermal-radical polymerization initiator with respect to 100 parts by mass of the radically polymerizable compound.

4. The coloring composition according to claim 1, further comprising:
   an alkali-soluble resin.

5. A cured film obtained from the coloring composition according to claim 1.

6. A pattern forming method comprising:
   forming a coloring composition layer on a support with the coloring composition according to claim 1;
   patternwise exposing the coloring composition layer;
   removing an unexposed area of the coloring composition by development to form a pattern; and
   heating the pattern after development.

7. A color filter comprising the cured film according to claim 5.

8. A solid-state imaging element comprising the color filter according to claim 7.

9. An image display device comprising the color filter according to claim 7.

10. The coloring composition according to claim 1,
    wherein the photo-radical polymerization initiator includes an oxime compound, and
    the coloring composition includes 100 to 1,000 parts by mass of the thermal-radical polymerization initiator with respect to 100 parts by mass of the photo-radical polymerization initiator.

11. The coloring composition according to claim 1,
    wherein the thermal-radical polymerization initiator further includes an α-hydroxyacetophenone compound.

12. The coloring composition according to claim 1,
    wherein the radically polymerizable compound includes an alkali-soluble resin having a polymerizable group.

13. The coloring composition according to claim 1,
    wherein the colorant includes C. I. Pigment Green 59.

14. The coloring composition according to claim 1,
    wherein the thermal-radical polymerization initiator includes a benzopinacol compound, and
    the coloring composition includes 5 to 180 parts by mass of the thermal-radical polymerization initiator with respect to 100 parts by mass of the radically polymerizable compound.

15. The coloring composition according to claim 1, further comprising:
    an epoxy compound.

16. The coloring composition according to claim 15,
    wherein the content of the epoxy compound is 5 to 100 parts by mass with respect to 100 parts by mass of the radically polymerizable compound.

* * * * *